US011600673B2

United States Patent
Park et al.

(10) Patent No.: US 11,600,673 B2
(45) Date of Patent: Mar. 7, 2023

(54) ORGANIC LIGHT EMITTING DIODE DISPLAY DEVICE INCLUDING DUMMY METAL LAYER IN NON-DISPLAY AREA

(71) Applicant: SAMSUNG DISPLAY CO., LTD., Yongin-si (KR)

(72) Inventors: Kyung Min Park, Seongnam-si (KR); Dong-Yoon So, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/387,271

(22) Filed: Dec. 21, 2016

(65) Prior Publication Data

US 2017/0301739 A1  Oct. 19, 2017

(30) Foreign Application Priority Data

Apr. 15, 2016  (KR) .......................... 10-2016-0046265

(51) Int. Cl.
*H01L 27/32* (2006.01)
*H01L 51/52* (2006.01)

(52) U.S. Cl.
CPC ...... *H01L 27/3246* (2013.01); *H01L 27/3251* (2013.01); *H01L 27/3276* (2013.01); *H01L 51/5246* (2013.01)

(58) Field of Classification Search
CPC ............. H01L 27/3276; H01L 27/3279; H01L 51/5246

(Continued)

(56) References Cited

U.S. PATENT DOCUMENTS 7,528,544 B2  5/2009  Deschamp
7,619,258 B2  11/2009  Tsuchiya et al.
(Continued)

FOREIGN PATENT DOCUMENTS

CN  1671255  9/2005
CN  101964161  2/2011
(Continued)

OTHER PUBLICATIONS

European Search Report dated Sep. 18, 2017 for European Patent Application No. 17166924.5.
(Continued)

*Primary Examiner* — Lex H Malsawma
*Assistant Examiner* — Eric W Jones
(74) *Attorney, Agent, or Firm* — F. Chau & Associates, LLC

(57) ABSTRACT

An organic light emitting device includes a first substrate including a display area and a non-display area, and a dummy metal layer disposed on the first substrate in the non-display area. The dummy metal layer includes a first dummy metal layer and a second dummy metal layer that overlap each other. The organic light emitting device further includes an insulating layer disposed between the first dummy metal layer and the second dummy metal layer in a cross-sectional view, a second substrate covering the first substrate, and a sealant disposed between the first substrate and the second substrate and overlapping the dummy metal layer. The first dummy metal layer is electrically connected to the second dummy metal layer, and the sealant contacts the second dummy metal layer.

25 Claims, 18 Drawing Sheets

(58) Field of Classification Search
USPC .................................................. 257/40, 59
See application file for complete search history.

(56) References Cited

U.S. PATENT DOCUMENTS

| | | | |
|---|---|---|---|
| 8,368,302 B2 | 2/2013 | Kang et al. | |
| 2005/0218396 A1* | 10/2005 | Tsuchiya | H01L 27/3246 257/13 |
| 2007/0170859 A1* | 7/2007 | Choi | H01L 27/3276 313/512 |
| 2007/0176550 A1* | 8/2007 | Kwan | H01L 51/5246 313/512 |
| 2007/0178796 A1* | 8/2007 | Kwak | H01L 27/3276 445/24 |
| 2009/0218925 A1* | 9/2009 | Kwak | H01L 27/3276 313/243 |
| 2010/0066232 A1* | 3/2010 | Kim | H01L 27/3276 313/317 |
| 2010/0079065 A1 | 4/2010 | Kamiura | |
| 2010/0109512 A1 | 5/2010 | Shin | |
| 2011/0063267 A1* | 3/2011 | Sim | H01L 27/3276 345/205 |
| 2013/0026505 A1* | 1/2013 | Lee | H01L 27/3279 257/88 |
| 2015/0048320 A1* | 2/2015 | Lee | H01L 27/1255 257/40 |
| 2015/0060789 A1* | 3/2015 | Cho | H01L 51/5234 257/40 |
| 2015/0060790 A1 | 3/2015 | Kim et al. | |
| 2015/0060893 A1* | 3/2015 | Cho | H01L 51/5246 257/88 |
| 2015/0084498 A1* | 3/2015 | Choi | H01L 51/5246 313/504 |
| 2015/0194625 A1 | 3/2015 | Kim | |
| 2015/0200239 A1 | 7/2015 | Jung | |
| 2015/0255527 A1* | 9/2015 | Oooka | G09G 3/006 257/88 |
| 2015/0270287 A1 | 9/2015 | Kim et al. | |

FOREIGN PATENT DOCUMENTS

| | | |
|---|---|---|
| EP | 1814183 A2 | 8/2007 |
| JP | 2005-49808 | 2/2005 |
| KR | 10-0611655 | 8/2006 |
| KR | 10-0703445 | 3/2007 |
| KR | 10-0095071 | 11/2010 |
| KR | 10-2011-0041321 | 4/2011 |
| KR | 1020150042622 | 4/2015 |

OTHER PUBLICATIONS

CN Office Action dated Mar. 18, 2021 in Corresponding Chinese Patent Application No. 201710247290.3.

JP Office Action dated Mar. 16, 2021 in Corresponding Japanese Patent Application No. 2017-081339.

CN Office Action dated Jun. 12, 2020 in Corresponding Chinese Patent Application No. 201710247290.3.

* cited by examiner

ORGANIC LIGHT EMITTING DIODE DISPLAY DEVICE INCLUDING DUMMY METAL LAYER IN NON-DISPLAY AREA

CROSS-REFERENCE TO RELATED APPLICATIONS

This application claims priority under 35 U.S.C. § 119 to Korean Patent Application No. 10-2016-0046265 filed on Apr. 15, 2016, the disclosure of which is incorporated by reference herein in its entirety.

TECHNICAL FIELD

Exemplary embodiments of the present invention relate to an organic light emitting device, and more particularly, to an organic light emitting device in which a sealant is prevented from peeling off of a substrate.

DISCUSSION OF THE RELATED ART

An organic light emitting diode display has a self-luminance characteristic and does not require a separate light source, unlike a liquid crystal display (LCD) device. As a result, an organic light emitting diode display may have a reduced thickness and weight. Further, the organic light emitting diode display has high-grade characteristics such as low power consumption, high luminance, a wide viewing angle, and a high response speed, making it a desirable choice for use in portable electronic devices.

In general, the organic light emitting device includes a first substrate on which thin film transistors and organic light emitting diodes are disposed, a second substrate covering the first substrate, and a sealant combining the first substrate and the second substrate. The sealant may be applied to edges of the first substrate and the second substrate, and seals a space between the first substrate and the second substrate.

The substrate includes a display area in which images are displayed and a non-display area in which a driver for driving the display area is disposed. The sealant is disposed in the non-display area. To improve adherence between the sealant and the substrate, a dummy metal layer may be disposed in the non-display area. Recently, according to a trend of reducing an area of the non-display area, an area of the dummy metal layer is also reduced and resistance of the dummy metal layer is increased. As a result, when static electricity occurs, charges are stored in the dummy metal layer, heat is generated, and the sealant may be stripped off of the substrate.

SUMMARY

According to an exemplary embodiment of the present invention, an organic light emitting device includes a first substrate including a display area and a non-display area, and a dummy metal layer disposed on the first substrate in the non-display area. The dummy metal layer includes a first dummy metal layer and a second dummy metal layer overlapping each other in a cross-sectional view. The organic light emitting device further includes an insulating layer disposed between the first dummy metal layer and the second dummy metal layer, a second substrate covering the first substrate, and a sealant disposed between the first substrate and the second substrate and overlapping the dummy metal layer. The first dummy metal layer is electrically connected to the second dummy metal layer, and the sealant contacts the second dummy metal layer.

In an exemplary embodiment, the insulating layer includes a first contact hole overlapping at least a part of the first dummy metal layer, and the second dummy metal layer is disposed on the insulating layer and is connected to the first dummy metal layer through the first contact hole.

In an exemplary embodiment, a resistivity of the second dummy metal layer is less than a resistivity of the first dummy metal layer.

In an exemplary embodiment, the first dummy metal layer is made of molybdenum, and the second dummy metal layer is made of aluminum.

In an exemplary embodiment, the organic light emitting device further includes a semiconductor disposed on the first substrate in the display area, a gate insulating layer disposed on the semiconductor, and a gate wire disposed on the gate insulating layer. The insulating layer is disposed on the gate wire. The organic light emitting device further includes a data wire disposed on the insulating layer.

In an exemplary embodiment, the first dummy metal layer is made of a same material as the gate wire and is provided in a same layer as the gate wire.

In an exemplary embodiment, the gate insulating layer includes a first gate insulating layer and a second gate insulating layer, and the gate wire includes a first gate wire disposed between the first gate insulating layer and the second gate insulating layer in a cross-sectional view, and a second gate wire disposed on the second gate insulating layer.

In an exemplary embodiment, the first dummy metal layer is made of a same material as the first gate wire or the second gate wire, and is disposed in a same layer as the first gate wire or the second gate wire.

In an exemplary embodiment, the second dummy metal layer is made of a same material as the data wire, and is disposed in a same layer as the data wire.

In an exemplary embodiment, the first dummy metal layer and the second dummy metal layer have a bar shape extending substantially parallel to an edge of the first substrate.

In an exemplary embodiment, a width of the second dummy metal layer is less than a width of the first dummy metal layer in a plan view.

In an exemplary embodiment, a first edge of the second dummy metal layer includes a first plurality of protrusions and depressions.

In an exemplary embodiment, the first edge of the second dummy metal layer is adjacent to the edge of the first substrate.

In an exemplary embodiment, a second edge of the second dummy metal layer that opposes the first edge of the dummy metal layer includes a second plurality of protrusions and depressions.

In an exemplary embodiment, a hole pattern is formed in the first dummy metal layer, a second contact hole is formed in the insulating layer, and the second contact hole is disposed in the hole pattern.

In an exemplary embodiment, the sealant is disposed in the second contact hole.

In an exemplary embodiment, the sealant contacts the first substrate through the second contact hole.

In an exemplary embodiment, a plurality of second contact holes is provided in the hole pattern.

In an exemplary embodiment, a plurality of hole patterns is disposed in a matrix form in the first dummy metal layer.

In an exemplary embodiment, the second dummy metal layer does not overlap the hole pattern.

In an exemplary embodiment, a first edge of the second dummy metal layer adjacent to the edge of the first substrate, and a second edge of the second dummy metal layer that opposes the first edge of the second dummy metal layer each comprise a plurality of protrusions and depressions.

In an exemplary embodiment, the insulating layer includes a first contact hole and a third contact hole overlapping at least a part of the first dummy metal layer, the second dummy metal layer is connected to the first dummy metal layer through the first contact hole, and the sealant contacts the first dummy metal layer through the third contact hole.

According to an exemplary embodiment of the present invention, an organic light emitting device includes a first substrate including a display area and a non-display area, a second substrate opposing the first substrate, and a pixel disposed on the first substrate in the display area. The pixel includes a storage capacitor, an organic light emitting diode including an anode and a cathode, a driving transistor including a first gate electrode, and a switching transistor including a second gate electrode. The organic light emitting device further includes a dummy metal layer disposed on the first substrate in the non-display area. The dummy metal layer includes a first dummy metal layer and a second dummy metal layer. The first dummy metal layer and the second dummy metal layer overlap each other. The organic light emitting device further includes an insulating layer disposed on the first substrate in the non-display area between the first dummy metal layer and the second dummy metal layer in a cross-sectional view, and a sealant disposed on the first substrate in the non-display area between the first substrate and the second substrate, and overlapping the dummy metal layer. The first dummy metal layer, the first gate electrode, and the second gate electrode are made of a same material.

In an exemplary embodiment, the first gate electrode is connected to a first end of the storage capacitor, a second end of the storage capacitor is connected to a driving voltage line, the second gate electrode is connected to a scan line, the anode is connected to a drain electrode of the driving transistor, and the cathode is connected to a common voltage line.

In an exemplary embodiment, the insulating layer includes a first contact hole overlapping at least a part of the first dummy metal layer, and the second dummy metal layer is disposed on the insulating layer and is connected to the first dummy metal layer through the first contact hole.

In an exemplary embodiment, a resistivity of the second dummy metal layer is less than a resistivity of the first dummy metal layer.

In an exemplary embodiment, the first dummy metal layer is made of molybdenum, and the second dummy metal layer is made of aluminum.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
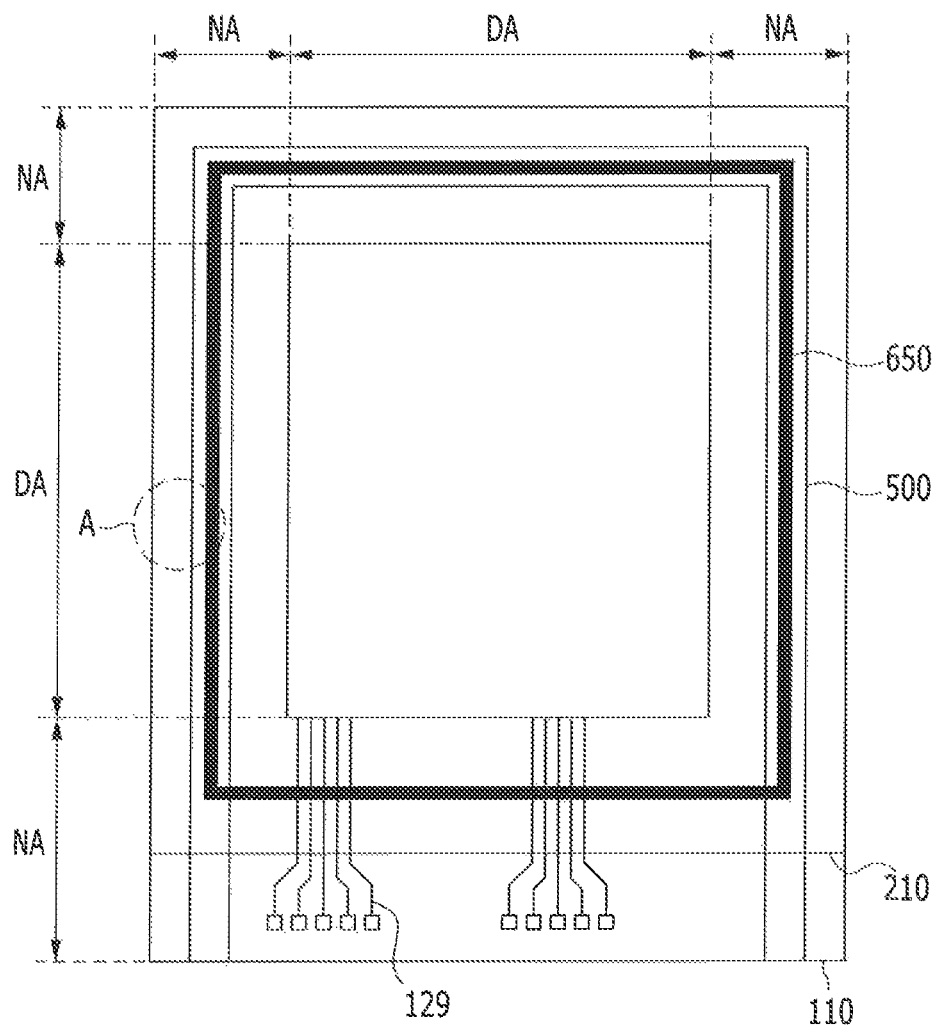
FIG. 1 shows a top plan view of an organic light emitting device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Further, when a first area or component is described as surrounding a second area or component, it is to be understood that the first area or component may entirely or partially surround the second area or component.

It will further be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art. Further, when two or more components or values are described as being substantially the same as or about equal to each other, it is to be understood that the components or values are identical to each other, indistinguishable from each other, or distinguishable from each other but functionally the same as each other as would be understood by a person having ordinary skill in the art. Further, when two processes are described as being performed simultaneously or at substantially the same time as each other, it is to be understood that the processes may be performed at exactly the same time or at about the same time as would be understood by a person having ordinary skill in the art.

An organic light emitting device according to an exemplary embodiment will now be described with reference to FIG. 1.

FIG. 1 shows a top plan view of an organic light emitting device according to an exemplary embodiment.

As shown in FIG. 1, the organic light emitting device includes a first substrate 110, a second substrate 210, and a sealant 650 provided between the first substrate 110 and the second substrate 210.

The first substrate 110 and the second substrate 210 may be made of an insulating material such as, for example, glass, quartz, ceramic, or plastic.

The first substrate 110 includes a display area (DA) in which a screen is disposed and an image is displayed, and a non-display area (NA) in which a driver for driving the display area (DA) is disposed. The non-display area (NA) surrounds the display area (DA). For example, the display area (DA) is disposed near a center of the first substrate 110, and the non-display area (NA) is disposed near an edge of the first substrate 110. Thin film transistors and organic light emitting diodes may be disposed in the display area (DA). The organic light emitting diodes may emit light for the respective pixels to display the image. A gate driver and a data driver that transmit predetermined signals for driving the display area (DA) are disposed in the non-display area (NA).

A dummy metal layer 500 is disposed in the non-display area (NA) of the first substrate 110. The dummy metal layer 500 surrounds part of the edge of the first substrate 110. The first substrate 110 may substantially form a rectangle, and the dummy metal layer 500 may be formed on three of four sides that form the rectangle. A fan-out portion 129 may be formed on the side on which the dummy metal layer 500 is not disposed. The dummy metal layer 500 may be disposed on a same layer as the fan-out portion 129 with a same metal material. Therefore, the dummy metal layer 500 and the fan-out portion 129 are provided at different positions so that they are not short-circuited.

The second substrate 210 is attached to the first substrate 110. The second substrate 210 may function as an encapsulation substrate for preventing moisture from permeating into a space between the first substrate 110 and the second substrate 210. The second substrate 210 may have a similar shape to that of the first substrate 110 and may be smaller than the first substrate 110. Therefore, part of the first substrate 110 may not be covered by the second substrate 210. For example, part of the first substrate 100 on which part of the fan-out portion 129 is disposed may be a portion that is not covered by the second substrate 210, as shown in FIG. 1.

The dummy metal layer 500 may extend to an end portion of the first substrate 110 near the fan-out portion 129. That is, the dummy metal layer 500 may extend to the end portion of the first substrate 110 in the portion where the first substrate 110 is not covered by the second substrate 210.

The sealant 650 is disposed in the non-display area (NA) of the first substrate 110 and overlaps the dummy metal layer 500. The sealant 650 may surround the edge (e.g., the entire edge) of the first substrate 110. That is, when the first substrate 110 forms a rectangle, the sealant 650 may be disposed on all four sides of the rectangle.

The sealant 650 may be made of a frit. When a glass material is heated at a high temperature and the temperature is manipulated to steeply decrease, a frit of a glass powder type is formed. When an oxide powder is added to the powder type frit and an organic material is added thereto, a paste in a gel state is formed. When the paste is applied to an edge of the second substrate 210 and is heated at a predetermined temperature, the organic material dissipates into the air, the paste in the gel state is hardened, and the sealant 650, which is now a solid frit, is attached to the second substrate 210. When a side of the second substrate 210 to which the sealant 650 is attached is disposed such that it contacts the first substrate 110, and laser beams or infrared rays are irradiated thereto, the sealant 650 is melted and attached to the first substrate 110, and the first substrate 110 is bonded to the second substrate 210. When the first substrate 110 is bonded to the second substrate 210 by the sealant 650, oxygen or moisture may be prevented from permeating into the space between the first substrate 110 and the second substrate 210. Therefore, the organic light emitting diode disposed in the display area (DA) of the first substrate 110 may be prevented from being exposed to the oxygen or moisture, thus preventing the organic light emitting diode from being damaged.

A configuration of the non-display area (NA) of the organic light emitting device according to an exemplary embodiment will now be described with reference to FIGS. 2 and 3.

Figure 2:
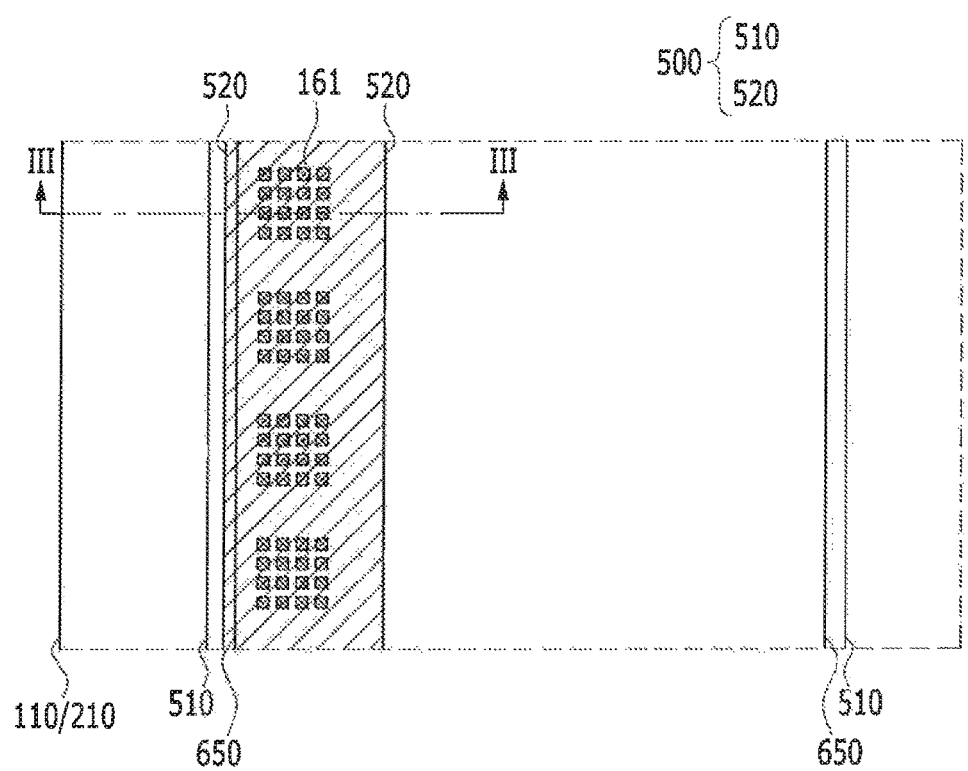
FIG. 2 shows a top plan view of an enlarged portion A of FIG. 1 of an organic light emitting device according to an exemplary embodiment of the present invention.

FIG. 2 shows a top plan view of an enlarged portion A of FIG. 1 of an organic light emitting device according to an exemplary embodiment. FIG. 3 shows a cross-sectional view of an organic light emitting device with respect to line III-III of FIG. 2 according to an exemplary embodiment. The portion A in FIG. 1 corresponds to the non-display area (NA).

Figure 3:
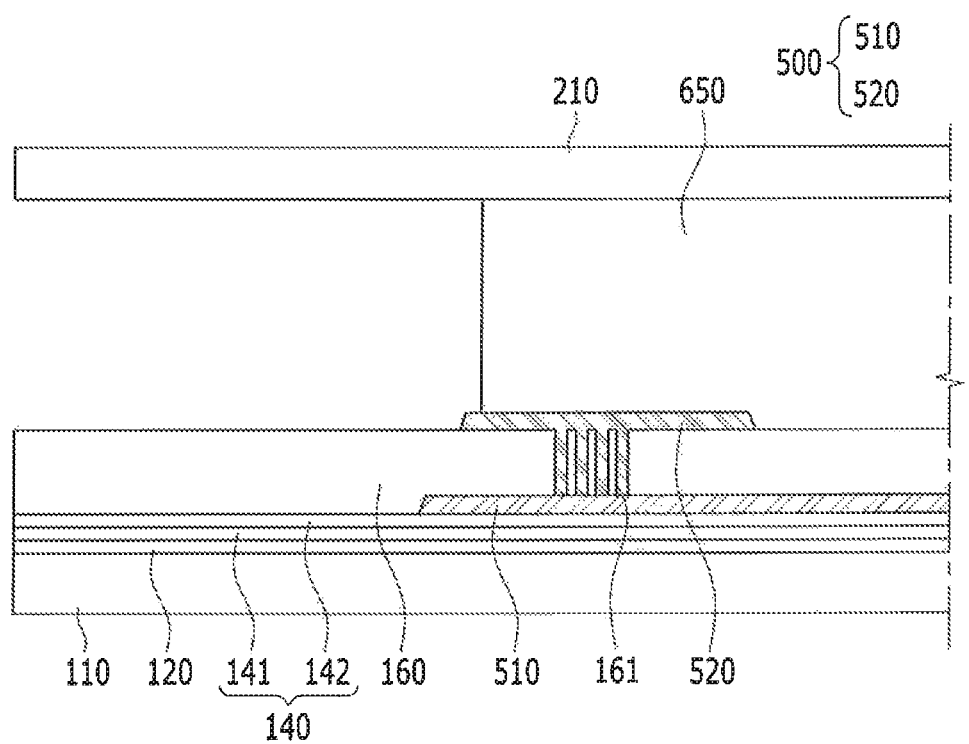
FIG. 3 shows a cross-sectional view of an organic light emitting device with respect to line III-III of FIG. 2 according to an exemplary embodiment of the present invention.

As shown in FIGS. 2 and 3, a buffer layer 120 may be disposed on the first substrate 110, and a gate insulating layer 140 may be disposed on the buffer layer 120.

The buffer layer 120 may be made of an inorganic insulating material such as, for example, a silicon nitride (SiNx) or a silicon oxide (SiOx). The buffer layer 120 may be formed of a single layer or multiple layers. The buffer layer 120 may prevent permeation of unnecessary components such as, for example, impurities or moisture, and substantially simultaneously flattens the surface. The buffer layer 120 may be disposed in the display area (DA) as well as the non-display area (NA) of the first substrate 110. Thus, the buffer layer 120 may be disposed on the entire side of the first substrate 110.

The gate insulating layer 140 may be made of an inorganic insulating material such as, for example, a silicon nitride (SiNx) or a silicon oxide (SiOx). The gate insulating layer 140 may be formed of a single layer or multiple layers. For example, the gate insulating layer 140 may include a first gate insulating layer 141 and a second gate insulating layer 142 disposed on the first gate insulating layer 141. The gate insulating layer 140 may be disposed in the display area (DA) as well as the non-display area (NA) of the first substrate 110. Thus, the gate insulating layer 140 may be disposed on the entire side of the first substrate 110.

Although the buffer layer 120 and the gate insulating layer 140 have been described above as being disposed on the entire side of the first substrate 110, the present invention is not limited thereto. For example, in an exemplary embodiment, the buffer layer 120 and the gate insulating layer 140 are not formed in the non-display area (NA) of the first substrate 110.

The dummy metal layer 500 is disposed on the gate insulating layer 140. The dummy metal layer 500 may be disposed on the second gate insulating layer 142. The dummy metal layer 500 may include a first dummy metal layer 510 and a second dummy metal layer 520. The first dummy metal layer 510 may overlap the second dummy metal layer 520. An interlayer insulating layer 160 may be disposed between the first dummy metal layer 510 and the second dummy metal layer 520.

The interlayer insulating layer 160 may be made of an inorganic insulating material or an organic insulating material. The interlayer insulating layer 160 may be configured with a single layer or multiple layers. The interlayer insulating layer 160 may be disposed by stacking a layer made of an organic insulating material and a layer made of an inorganic insulating material. The interlayer insulating layer 160 may be disposed in the display area (DA) as well as the non-display area (NA) of the first substrate 110. Thus, the interlayer insulating layer 160 may be disposed on the entire side of the first substrate 110.

The first dummy metal layer 510 may be disposed on the second gate insulating layer 142, and the interlayer insulating layer 160 may be disposed on the first dummy metal layer 510. A first contact hole 161 overlapping at least part of the first dummy metal layer 510 is disposed in the interlayer insulating layer 160. The first contact hole 161 may be disposed in a matrix form in a horizontal direction and a vertical direction on the plane. For example, as shown in FIG. 2, in an exemplary embodiment, sixteen first contact holes 161 disposed in a 4×4 matrix may form one set, and a plurality of sets of the first contact holes 161 may be disposed in a column direction with a predetermined gap therebetween. However, the form of the first contact hole 161, and the amount of first contact holes 161 that form each set and that are included in the organic light emitting device are not limited thereto.

The second dummy metal layer 520 may be disposed on the interlayer insulating layer 160. The second dummy metal layer 520 is disposed in the first contact hole 161 and is connected to the first dummy metal layer 510 through the first contact hole 161. Therefore, the first dummy metal layer 510 is electrically connected to the second dummy metal layer 520. The resistivity of the second dummy metal layer 520 may be less than the resistivity of the first dummy metal layer 510. For example, the first dummy metal layer 510 may include molybdenum, and the second dummy metal layer 520 may include titanium or aluminum. The first dummy metal layer 510 may be formed of a single layer of molybdenum. The second dummy metal layer 520 may be formed of three layers including titanium, aluminum, and titanium.

The sealant 650 is disposed on the second dummy metal layer 520, and the second dummy metal layer 520 contacts (e.g., directly contacts) the sealant 650. When static electricity is applied to the sealant 650, most of the charges may be dispersed to the dummy metal layer 500 since the sealant 650 contacts the dummy metal layer 500, which is made of a metal material. The dummy metal layer 500 includes the first dummy metal layer 510 and the second dummy metal layer 520, which are electrically connected to each other. As a result, resistance of the dummy metal layer 500 when it includes the first and second dummy metal layers 510 and 520 connected to each other may be lower than a case in which the dummy metal layer 500 is formed as a single layer. For example, the dummy metal layer 500 further includes the second dummy metal layer 520 with relatively less resistivity than a case in which the dummy metal layer 500 is formed with the first dummy metal layer 510 with relatively greater resistivity, further lowering the resistance. As described, when the resistance of the dummy metal layer 500 contacting the sealant 650 is reduced, the dispersing effect of charges becomes greater, and the sealant 650 may be prevented from being separated from the first substrate 110 by the static electricity.

The second substrate 210 is disposed on the sealant 650. The sealant 650 is formed along the edge between the first substrate 110 and second substrate 210. As a result, moisture may be prevented from permeating into the space between the first substrate 110 and the second substrate 210.

In an exemplary embodiment, the first dummy metal layer 510 and the second dummy metal layer 520 may have a bar shape extending substantially parallel to the edge of the first substrate 110. For example, the first dummy metal layer 510 and the second dummy metal layer 520 may extend lengthwise in a direction substantially parallel to that in which the edge of the first substrate 110 extends. A width of the second dummy metal layer 520 may be less than a width of the first dummy metal layer 510 (e.g., a width of the second dummy metal layer 520 may be narrower than a width of the first dummy metal layer 510 in a plan view, as shown in FIG. 2). In an exemplary embodiment, the entire second dummy metal layer 520 may overlap part of the first dummy metal layer 510. The second dummy metal layer 520 may overlap an edge portion of the first dummy metal layer 510. For example, the second dummy metal layer 520 may overlap the edge portion of the first dummy metal layer 510 disposed near the edge of the first substrate 110. Static electricity may be transmitted through an outer portion of the sealant 650. Thus, the second dummy metal layer 520 may be disposed at a position that is nearest the edge of the first substrate 110 when static electricity is dispersed.

Although an exemplary embodiment has been described in which a width of the second dummy metal layer 520 is less than a width of the first dummy metal layer 510, resulting in the second dummy metal layer 520 overlapping part of the first dummy metal layer 510, the present invention is not limited thereto. For example, in an exemplary embodiment, the width of the second dummy metal layer 520 may substantially correspond to the width of the first dummy metal layer 510 (e.g., the widths of the first and second dummy metal layers 510 and 520 may be substantially equal), and the second dummy metal layer 520 may overlap the entire first dummy metal layer 510.

An organic light emitting device according to an exemplary embodiment will now be described with reference to FIGS. 4 to 8.

Figure 4:
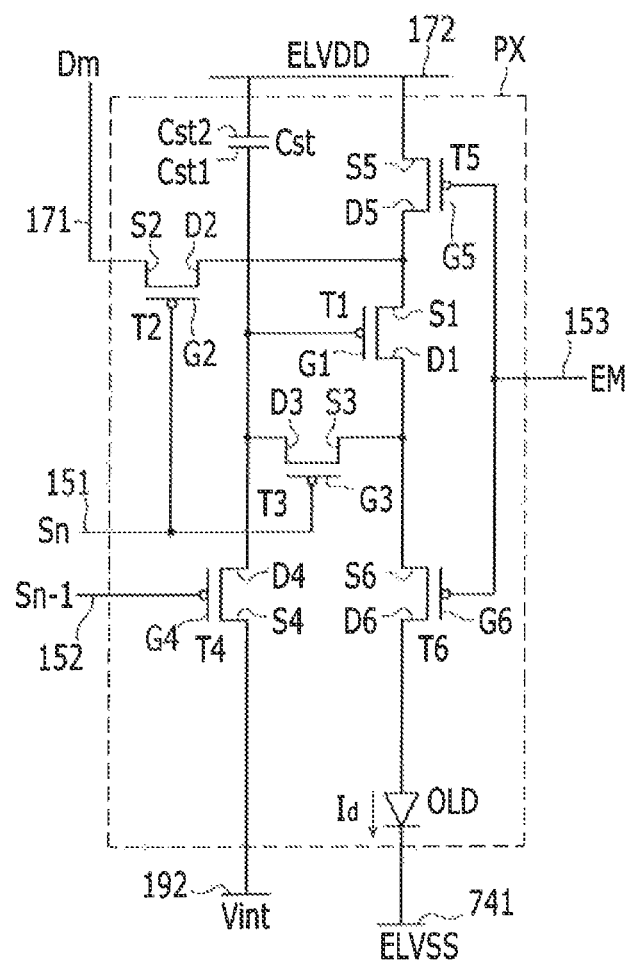
FIG. 4 shows an equivalent circuit diagram of one pixel of an organic light emitting device according to an exemplary embodiment of the present invention.

FIG. 4 shows an equivalent circuit diagram of one pixel of an organic light emitting device according to an exemplary embodiment.

As shown in FIG. 4, the organic light emitting device includes a plurality of signal lines 151, 152, 153, 171, 172, and 192, and a plurality of pixels PX connected to the signal lines and substantially arranged in a matrix form.

The respective pixels PX include a plurality of transistors T1, T2, T3, T4, T5, and T6 connected to the plurality of signal lines 151, 152, 153, 171, 172, and 192, a storage capacitor (Cst), and an organic light emitting diode (OLD).

The transistors T1, T2, T3, T4, T5, and T6 include a driving transistor T1, a switching transistor T2, a compensation transistor T3, an initialization transistor T4, an operation control transistor T5, and a light emission control transistor T6. The signal lines 151, 152, 153, 171, 172, and 192 include a scan line 151 for transmitting a scan signal (Sn), a previous-stage scan line 152 for transmitting a previous-stage scan signal Sn−1 to the initialization transistor T4, a light emission control line 153 for transmitting a light emission control signal (EM) to the operation control transistor T5 and the light emission control transistor T6, a data line 171 crossing the scan line 151 and transmitting a data signal (Dm), a driving voltage line 172 transmitting a driving voltage (ELVDD) and disposed substantially parallel to the data line 171, and an initialization voltage line 192 for transmitting an initialization voltage (Vint) for initializing the driving transistor T1.

The driving transistor T1 includes a gate electrode G1 connected to a first end Cst1 of the storage capacitor Cst, a source electrode S1 connected to the driving voltage line 172 via the operation control transistor T5, and a drain electrode D1 electrically connected to an anode of the organic light emitting diode (OLD) via the light emission control transistor T6. The driving transistor T1 receives the data signal (Dm) according to switching by the switching transistor T2, and supplies a driving current (Id) to the organic light emitting diode (OLD).

The switching transistor T2 includes a gate electrode G2 connected to the scan line 151, a source electrode S2 connected to the data line 171, and a drain electrode D2 connected to the source electrode S1 of the driving transistor T1 and to the driving voltage line 172 via the operation control transistor T5. The switching transistor T2 is turned on by the scan signal (Sn) provided through the scan line 151 to perform a switching operation for transmitting the data signal (Dm) provided through the data line 171 to the source electrode S1 of the driving transistor T1.

The compensation transistor T3 includes a gate electrode G3 connected to the scan line 151, a source electrode S3 connected to the drain electrode D1 of the driving transistor T1 and to the anode of the organic light emitting diode (OLD) via the light emission control transistor T6, and a drain electrode D3 connected to a drain electrode D4 of the initialization transistor T4, the first end Cst1 of the storage capacitor Cst, and the gate electrode G1 of the driving transistor T1. The compensation transistor T3 is turned on by the scan signal (Sn) provided through the scan line 151 to connect the gate electrode G1 and the drain electrode D1 of the driving transistor T1, resultantly diode-connecting the driving transistor T1.

The initialization transistor T4 includes a gate electrode G4 connected to the previous-stage scan line 152, a source electrode S4 connected to the initialization voltage line 192, and a drain electrode D4 connected to the first end Cst1 of the storage capacitor Cst and the gate electrode G1 of the driving transistor T1 through the drain electrode D3 of the compensation transistor T3. The initialization transistor T4 is turned on by a previous-stage scan signal Sn−1 provided through the previous-stage scan line 152 to transmit the initialization voltage (Vint) to the gate electrode G1 of the driving transistor T1 and perform an initialization operation for initializing a gate voltage (Vg) at the gate electrode G1 of the driving transistor T1.

The operation control transistor T5 includes a gate electrode G5 connected to the light emission control line 153, a source electrode S5 connected to the driving voltage line 172, and a drain electrode D5 connected to the source electrode S1 of the driving transistor T1 and the drain electrode D2 of the switching transistor T2.

The light emission control transistor T6 includes a gate electrode G6 connected to the light emission control line 153, a source electrode S6 connected to the drain electrode D1 of the driving transistor T1 and the source electrode S3 of the compensation transistor T3, and a drain electrode D6 electrically connected to the anode of the organic light emitting diode (OLD). The operation control transistor T5 and the light emission control transistor T6 are substantially simultaneously turned on by a light emission control signal (EM) provided through the light emission control line 153, and the driving voltage (ELVDD) is compensated through the diode-connected driving transistor T1 and is transmitted to the organic light emitting diode (OLD).

The storage capacitor Cst includes a second end Cst2 connected to the driving voltage line 172, and the organic light emitting diode (OLD) includes a cathode connected to a common voltage line 741 for transmitting a common voltage (ELVES).

A detailed configuration of an organic light emitting device according to an exemplary embodiment shown in FIG. 4 will now be described with reference to FIGS. 5, 6, 7, and 8.

Figure 5:
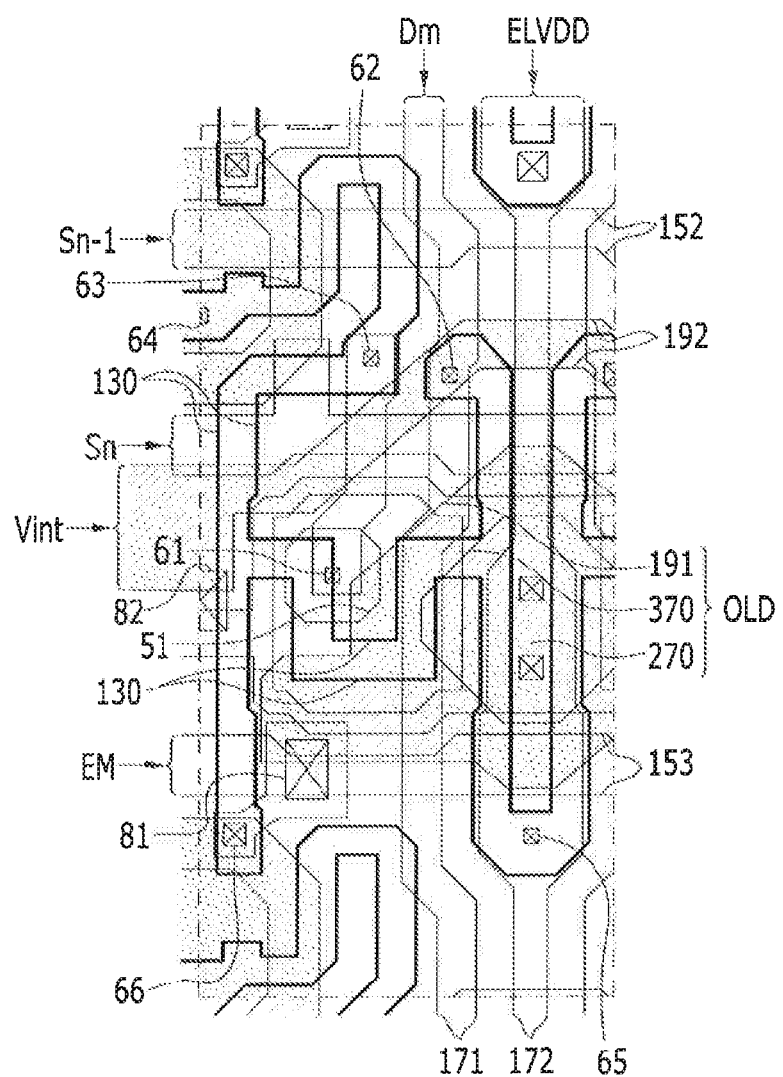
FIG. 5 shows a layout view of a plurality of transistors and capacitors of an organic light emitting device according to an exemplary embodiment of the present invention.
Figure 6:
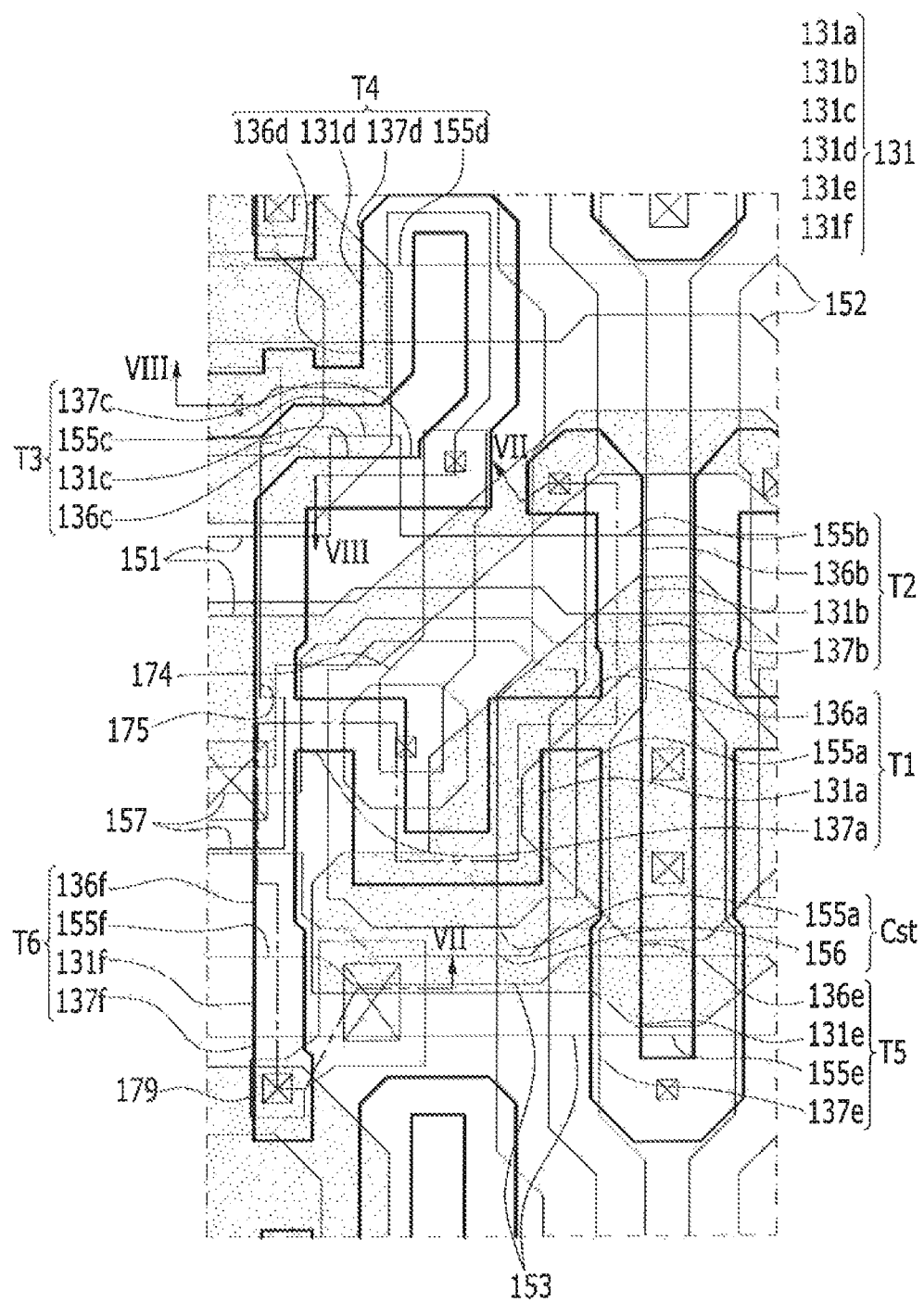
FIG. 6 shows a detailed layout view of FIG. 5 according to an exemplary embodiment of the present invention.
Figure 7:
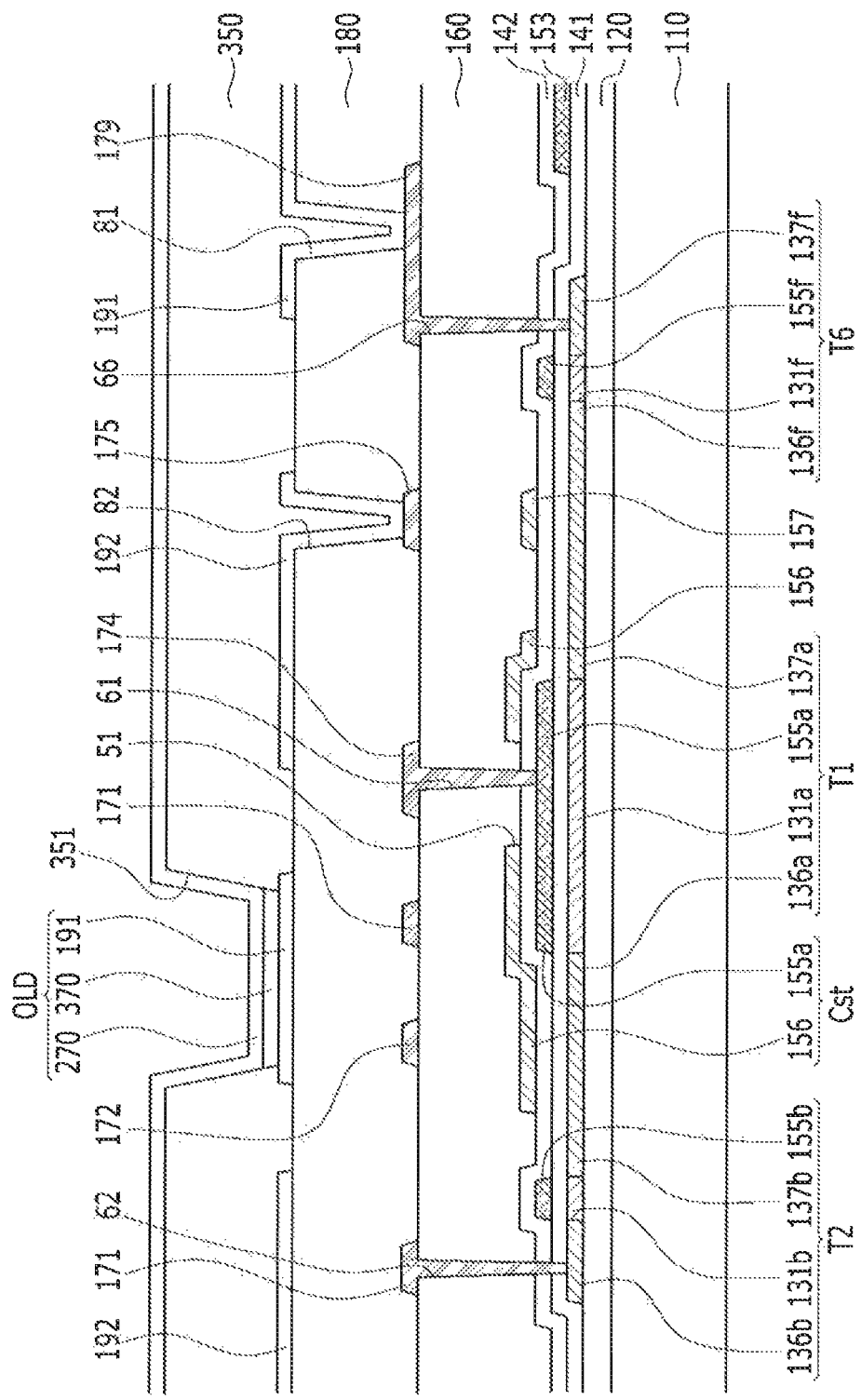
FIG. 7 shows a cross-sectional view of the organic light emitting device of FIG. 6 with respect to line VII-VII according to an exemplary embodiment of the present invention.
Figure 8:
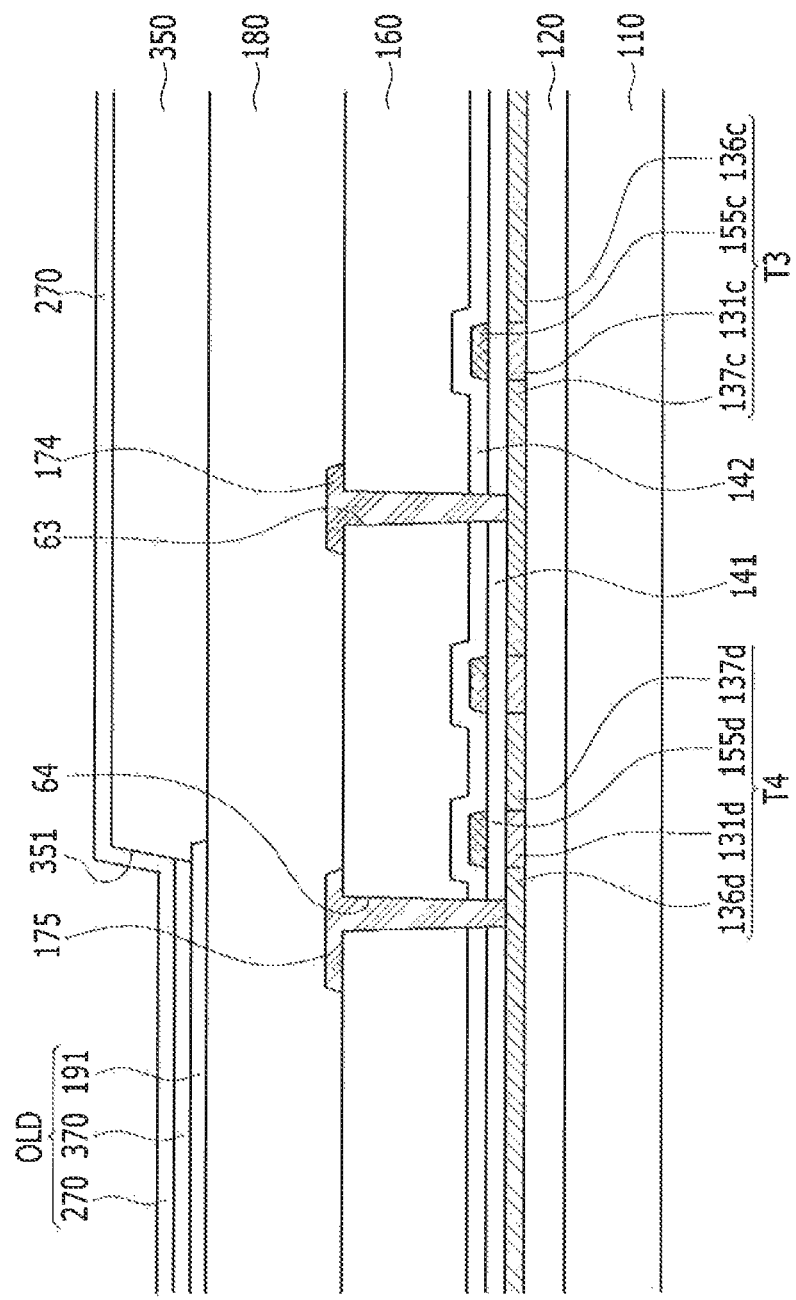
FIG. 8 shows a cross-sectional view of the organic light emitting device of FIG. 6 with respect to line VIII-VIII according to an exemplary embodiment of the present invention.

FIG. 5 shows a layout view of a plurality of transistors and capacitors of an organic light emitting device according to an exemplary embodiment. FIG. 6 shows a detailed layout view of FIG. 5 according to an exemplary embodiment. FIG. 7 shows a cross-sectional view of the organic light emitting device of FIG. 6 with respect to line VII-VII according to an exemplary embodiment. FIG. 8 shows a cross-sectional view of the organic light emitting device of FIG. 6 with respect to line VIII-VIII according to an exemplary embodiment.

A detailed top plan view configuration of an organic light emitting device according to an exemplary embodiment will now be described with reference to FIGS. 5 and 6, and a cross-sectional configuration thereof will be described with reference to FIGS. 7 and 8.

The organic light emitting device includes the scan line 151, the previous-stage scan line 152, and the light emission control line 153 for applying the scan signal (Sn), the previous-stage scan signal (Sn−1), and the light emission control signal (EM), respectively. The scan line 151, the previous-stage scan line 152, and the light emission control line 153 are disposed in a row direction. The organic light emitting device includes the data line 171 and the driving voltage line 172 crossing the scan line 151, the previous-stage scan line 152, and the light emission control line 153, and respectively applying the data signal (Dm) and the driving voltage (ELVDD) to the pixel PX. The initialization voltage (Vint) is transmitted to the compensation transistor T3 from the initialization voltage line 192 via the initialization transistor T4. The initialization voltage line 192 includes a linear portion and an oblique portion that are alternately arranged. For example, the initialization voltage line 192 may include a plurality of portions extending from one another at different angles.

Further, the pixel PX includes the driving transistor T1, the switching transistor T2, the compensation transistor T3, the initialization transistor T4, the operation control transistor T5, the light emission control transistor T6, the storage capacitor Cst, and the organic light emitting diode (OLD).

The organic light emitting diode (OLD) includes a pixel electrode 191, an organic emission layer 370, and a common electrode 270.

Each channel of the driving transistor T1, the switching transistor T2, the compensation transistor T3, the initialization transistor T4, the operation control transistor T5, and the light emission control transistor T6 is formed in one connected semiconductor 130. The semiconductor 130 may be bent in various shapes. The semiconductor 130 may be made of, for example, polysilicon or an oxide semiconductor.

The channel 131 includes a driving channel 131a provided to the driving transistor T1, a switching channel 131b provided to the switching transistor T2, a compensation channel 131c provided to the compensation transistor T3, an initialization channel 131d provided to the initialization transistor T4, an operation control channel 131e provided to the operation control transistor T5, and a light emission control channel 131f provided to the light emission control transistor T6.

The driving transistor T1 includes the driving channel 131a, a driving gate electrode 155a, a driving source electrode 136a, and a driving drain electrode 137a. The driving gate electrode 155a overlaps the driving channel 131a, and the driving source electrode 136a and the driving drain electrode 137a are disposed on respective nearby sides of the driving channel 131a. The driving gate electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b that is part of a portion extending downward from the scan line 151 overlaps the switching channel 131b. The switching source electrode 136b and the switching drain electrode 137b are formed on respective nearby sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c which is part of the scan line 151 overlaps the compensation channel 131c. The compensation source electrode 136c and the compensation drain electrode 137c are disposed on respective nearby sides of the compensation channel 131c. The compensation drain electrode 137c is connected to the first data connecting member 174 through a contact hole 63.

The initialization transistor T4 includes the initialization channel 131d, an initialization gate electrode 155d, an initialization source electrode 136d, and an initialization drain electrode 137d. Two initialization gate electrodes 155d (e.g., part of the previous-stage scan line 152) may prevent a leakage current and overlap the initialization channel 131d. The initialization source electrode 136d and the initialization drain electrode 137d are disposed on respective nearby sides of the initialization channel 131d. The initialization source electrode 136d is connected to the second data connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e that is part of the light emission control line 153 overlaps the operation control channel 131e. The operation control source electrode 136e and the operation control drain electrode 137e are disposed on respective nearby sides of the operation control channel 131e. The operation control source electrode 136e is connected to a part extending from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f which is part of the light emission control line 153 overlaps the light emission control channel 131f. The light emission control source electrode 136f and the light emission control drain electrode 137f are formed on respective nearby sides of the light emission control channel 131f. The light emission control drain electrode 137f is connected to a third data connecting member 179 through a contact hole 66.

The driving channel 131a of the driving transistor T1 includes a first end connected to the switching drain electrode 137b and the operation control drain electrode 137e, and a second end connected to the compensation source electrode 136c and the light emission control source electrode 136f.

The storage capacitor Cst includes the first storage electrode 155a and a second storage electrode 156 disposed with the second gate insulating layer 142 therebetween. The first storage electrode 155a corresponds to the driving gate electrode 155a. The second storage electrode 156 extends from the storage line 157, is larger than the driving gate electrode 155a, and covers the entire driving gate electrode 155a.

Here, the second gate insulating layer 142 becomes a dielectric material, and storage capacitance is determined by a voltage between the charges stored in the storage capacitor Cst and the capacitive plates 155a and 156. By using the driving gate electrode 155a as a first storage electrode 155a, a space for providing a storage capacitor may be acquired in the space that is narrowed by the driving channel 131a occupying a large area in the pixel.

The first storage electrode 155a that is the driving gate electrode 155a is connected to a first end of the first data connecting member 174 through the contact hole 61 and a storage opening 51. The storage opening 51 is an opening formed in the second storage electrode 156. Therefore, the contact hole 61 connecting the first end of the first data connecting member 174 and the driving gate electrode 155a is disposed in the storage opening 51. The first data connecting member 174 is disposed on a same layer as the data line 171 and extends in a direction substantially parallel to the direction in which the data line 171 extends. A second end of the first data connecting member 174 is connected to the compensation drain electrode 137c of the compensation transistor T3 and the initialization drain electrode 137*d* of the initialization transistor T4 through the contact hole 63. Therefore, the first data connecting member 174 connects the driving gate electrode 155*a*, the compensation drain electrode 137*c* of the compensation transistor T3, and the initialization drain electrode 137*d* of the initialization transistor T4.

Therefore, the storage capacitor Cst stores a storage capacitance corresponding to a difference between the driving voltage (ELVDD) transmitted to the second storage electrode 156 through the driving voltage line 172 and the driving gate voltage (Vg) of the driving gate electrode 155*a*.

The third data connecting member 179 is connected to the pixel electrode 191 through a contact hole 81. The second data connecting member 175 is connected to the initialization voltage line 192 through a contact hole 82.

A cross-sectional configuration of an organic light emitting device according to an exemplary embodiment will now be described with respect to a stacking order.

The buffer layer 120 is formed on the substrate 110.

The semiconductor 130 including a channel 131, which includes the driving channel 131*a*, the switching channel 131*b*, the compensation channel 131*c*, the initialization channel 131*d*, the operation control channel 131*e*, and the light emission control channel 131*f*, is formed on the buffer layer 120. The driving source electrode 136*a* and the driving drain electrode 137*a* are disposed on respective sides of the driving channel 131*a* of the semiconductor 130. A switching source electrode 136*b* and a switching drain electrode 137*b* are disposed on respective sides of the switching channel 131*b*. The compensation source electrode 136*c* and the compensation drain electrode 137*c* are disposed on respective sides of the compensation channel 131*c*. The initialization source electrode 136*d* and the initialization drain electrode 137*d* are disposed on respective sides of the initialization channel 131*d*. The operation control source electrode 136*e* and the operation control drain electrode 137*e* are disposed on respective sides of the operation control channel 131*e*. The light emission control source electrode 136*f* and the light emission control drain electrode 137*f* are disposed on respective sides of the light emission control channel 131*f*.

The first gate insulating layer 141, which covers the semiconductor 130, is formed on the semiconductor 130. First gate wires 151, 152, 153, 155*a*, 155*b*, 155*c*, 155*d*, 155*e*, and 155*f*, which include the scan line 151 including the switching gate electrode 155*b* and the compensation gate electrode 155*c*, the previous-stage scan line 152 including the initialization gate electrode 155*d*, the light emission control line 153 including the operation control gate electrode 155*e* and the light emission control gate electrode 155*f*, and the driving gate electrode (e.g., a first storage electrode) 155*a* are formed on the first gate insulating layer 141.

The second gate insulating layer 142, which covers the first gate wires 151, 152, 153, 155*a*, 155*b*, 155*c*, 155*d*, 155*e*, and 155*f* and the first gate insulating layer 141, is formed on the first gate wires 151, 152, 153, 155*a*, 155*b*, 155*c*, 155*d*, 155*e*, and 155*f* and the first gate insulating layer 141.

Second gate wires 157 and 156, which include the storage line 157 disposed substantially parallel to the scan line 151 and the second storage electrode 156 which is a portion extending from the storage line 157, are formed on the second gate insulating layer 142. The first dummy metal layer 510 disposed in the non-display area (NA) may be made of a same material as the second gate wires 157 and 156 disposed in the display area (D). In addition, the first dummy metal layer 510 may be disposed in a same layer as the second gate wires 157 and 156. The second gate wires 157 and 156 and the first dummy metal layer 510 may be substantially simultaneously formed by depositing a metal material on the second gate insulating layer 142 and patterning the same.

The interlayer insulating layer 160 is formed on the second gate insulating layer 142 and the second gate wires 157 and 156.

Contact holes 61, 62, 63, 64, 65, and 66, which expose at least part of an upper side of the semiconductor 130, are formed in the interlayer insulating layer 160.

Data wires 171, 172, 174, 175, and 179, which include the data line 171, the driving voltage line 172, the first data connecting member 174, the second data connecting member 175, and the third data connecting member 179, are formed on the interlayer insulating layer 160. The second dummy metal layer 520 disposed in the non-display area (NA) may be made of a same material as the data wires 171, 172, 174, 175, and 179 disposed in the display area (DA). Further, the second dummy metal layer 520 may be disposed in a same layer as the data wires 171, 172, 174, 175, and 179. The data wires 171, 172, 174, 175, and 179 and the second dummy metal layer 520 may be substantially simultaneously formed by depositing a metal material on the interlayer insulating layer 160 and patterning the same.

The data line 171 is connected to the switching source electrode 136*b* through the contact hole 62. The first data connecting member 174 includes a first end connected to the first storage electrode 155*a* through the contact hole 61, and a second end connected to the compensation drain electrode 137*c* and the initialization drain electrode 137*d* through the contact hole 63. The second data connecting member 175, which extends in a direction substantially parallel to that of the data line 171, is connected to the initialization source electrode 136*d* through the contact hole 64. The third data connecting member 179 is connected to the light emission control drain electrode 137*f* through the contact hole 66.

A passivation layer 180 covering the data wires 171, 172, 174, 175, and 179 and the interlayer insulating layer 160 is formed on the data wires 171, 172, 174, 175, and 179 and the interlayer insulating layer 160.

The pixel electrode 191 and the initialization voltage line 192 are formed on the passivation layer 180. The third data connecting member 179 is connected to the pixel electrode 191 through the contact hole 81 formed in the passivation layer 180, and the second data connecting member 175 is connected to the initialization voltage line 192 through the contact hole 82 formed in the passivation layer 180.

A pixel defined layer (PDL) 350 that covers the passivation layer 180, the initialization voltage line 192, and the pixel electrode 191 is formed on the passivation layer 180, the initialization voltage line 192, and the pixel electrode 191. For example, the pixel defined layer 350 may be formed on edges of the passivation layer 180, the initialization voltage line 192, and the pixel electrode 191. The pixel defined layer 350 includes a pixel opening 351 that exposes the pixel electrode 191.

The organic emission layer 370 is disposed on the pixel electrode 191 exposed by the pixel opening 351, and the common electrode 270 is disposed on the organic emission layer 370. The common electrode 270 is formed on the pixel defined layer 350 and is formed throughout a plurality of pixels PX. In this way, the organic light emitting diode (OLD) including the pixel electrode 191, the organic emission layer 370, and the common electrode 270 is formed.

According to an exemplary embodiment of the present invention, a method of manufacturing an organic light emitting device includes disposing the first dummy metal layer 510 on the first substrate 110 in the non-display area (NA), disposing the interlayer insulating layer 160 on the first dummy metal layer 510, and forming the first contact hole 161 in the interlayer insulating layer 160. The first contact hole 161 overlaps a portion of the first dummy metal layer 510. The method further includes disposing the second dummy metal layer 520 on the interlayer insulating layer 160 and within the first contact hole 161. The second dummy metal layer 520 overlaps the first dummy metal layer 510 and is electrically connected to the first dummy metal layer 510 through the first contact hole 161. The method further includes attaching the second substrate 210 to the first substrate 110 using the sealant 650. The sealant 650 is disposed between the first substrate 110 and the second substrate 210, and the sealant 650 overlaps and contacts the second dummy metal layer 520.

An organic light emitting device according to an exemplary embodiment will now be described with reference to FIG. 9.

The organic light emitting device according to the exemplary embodiment shown in FIG. 9 includes similar elements and configurations as those described with reference to the organic light emitting device according to the exemplary embodiment shown in FIG. 1 to FIG. 8. For convenience of explanation, a further description of elements and configurations previously described may be omitted herein. In the exemplary embodiment described with reference to FIG. 9, a formation position of the first dummy metal layer is different from the exemplary embodiment previously described. An exemplary embodiment according to FIG. 9 will now be described.

Figure 9:
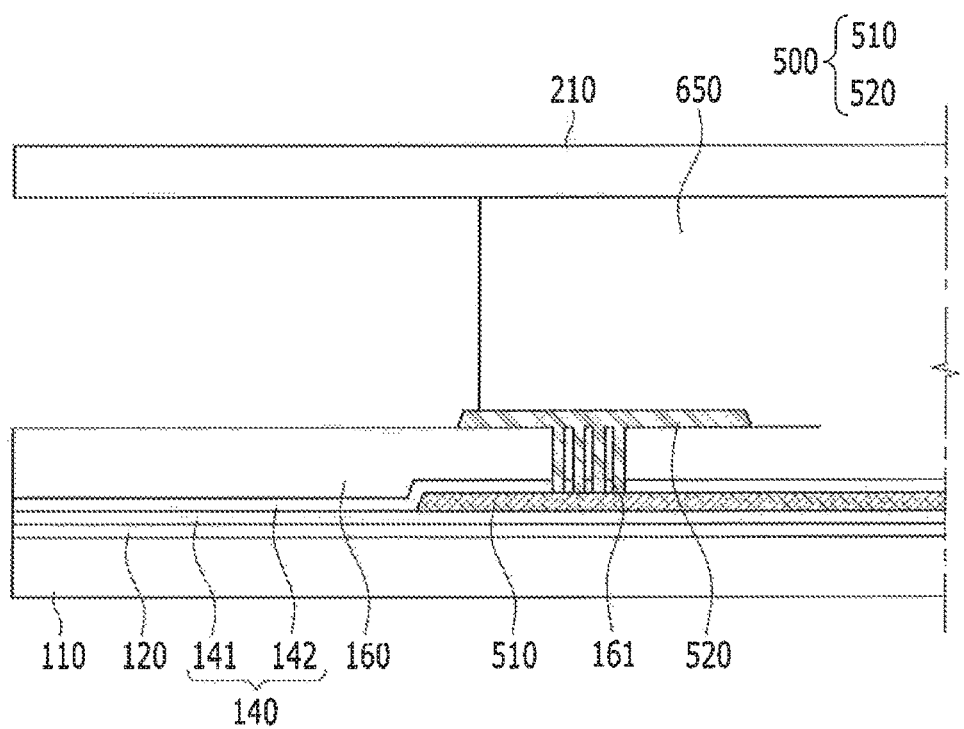
FIG. 9 shows a cross-sectional view of an organic light emitting device according to an exemplary embodiment of the present invention.

FIG. 9 shows a cross-sectional view of an organic light emitting device according to an exemplary embodiment. FIG. 9 shows the portion A that is in the non-display area (NA) of FIG. 1, similar to FIG. 3.

In the exemplary embodiment previously described, the first dummy metal layer 510 is disposed above the second gate insulating layer 142. In the exemplary embodiment shown in FIG. 9, the first dummy metal layer 510 is disposed below the second gate insulating layer 142. The first dummy metal layer 510 is disposed between the first gate insulating layer 141 and the second gate insulating layer 142.

The first dummy metal layer 510 provided in the non-display area (NA) may be made of a same material as the first gate wires 151, 152, 153, 155a, 155b, 155c, 155d, 155e, and 155f of FIGS. 5 to 8 disposed in the display area (DA). The first dummy metal layer 510 may be disposed in a same layer as the first gate wires 151, 152, 153, 155a, 155b, 155c, 155d, 155e, and 155f. The first gate wires 151, 152, 153, 155a, 155b, 155c, 155d, 155e, and 155f of FIGS. 5 to 8 and the first dummy metal layer 510 may be substantially simultaneously formed by depositing a metal material on the first gate insulating layer 141 and patterning the same.

An organic light emitting device according to an exemplary embodiment will now be described with reference to FIG. 10.

The organic light emitting device according to the exemplary embodiment shown in FIG. 10 includes similar elements and configurations as those described with reference to the organic light emitting device according to the exemplary embodiment shown in FIGS. 1 to 8. For convenience of explanation, a further description of elements and configurations previously described may be omitted herein. In the exemplary embodiment described with reference to FIG. 9, a shape of an edge of the second dummy metal layer is different from that of the exemplary embodiment previously described. An exemplary embodiment according to FIG. 10 will now be described.

Figure 10:
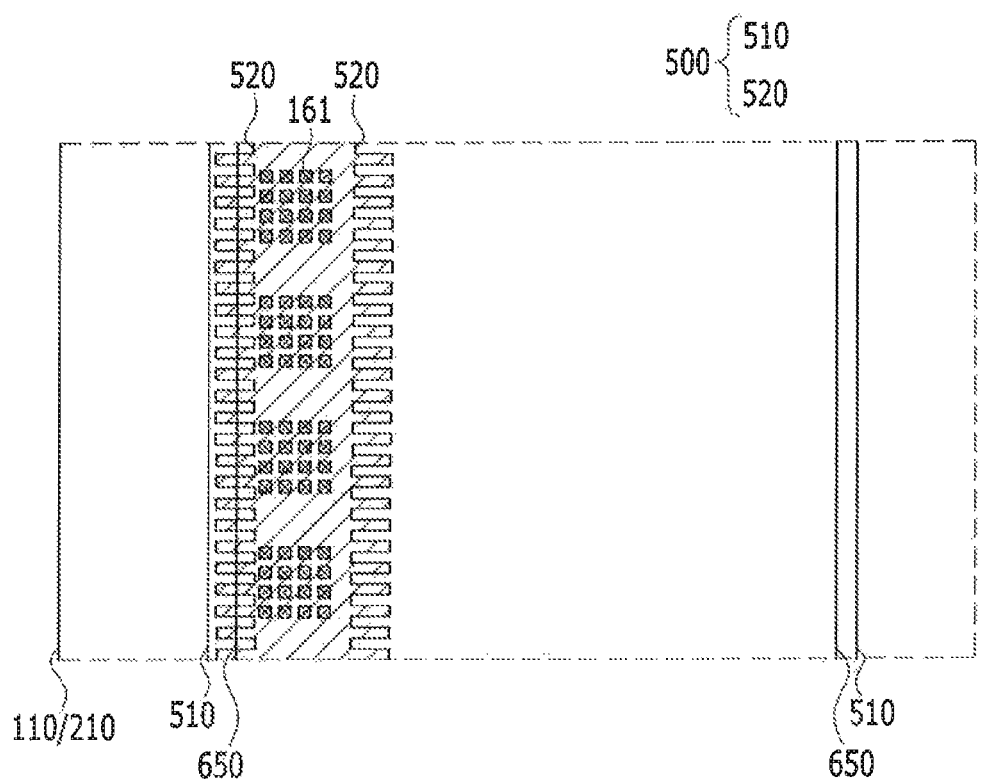
FIG. 10 shows a top plan view of an organic light emitting device according to an exemplary embodiment of the present invention.

FIG. 10 shows a top plan view of an organic light emitting device according to an exemplary embodiment. FIG. 10 shows the portion A that is in the non-display area (NA) of FIG. 1, similar to FIG. 2.

As shown in FIG. 10, the organic light emitting device includes the first substrate 110, the dummy metal layer 500 disposed on the first substrate 110, the second substrate 210 that covers the first substrate 110, and the sealant 650 that bonds the first substrate 110 and the second substrate 210, similar to the previous exemplary embodiment.

The dummy metal layer 500 includes the first dummy metal layer 510 and the second dummy metal layer 520. In the exemplary embodiment previously described, the second dummy metal layer 520 has a bar shape extending substantially parallel to the edge of the first substrate 110, and an edge of the second dummy metal layer 520 has a linear shape (e.g., the edge of the second dummy metal layer 520 extends in a substantially straight line) (see FIG. 2). In the exemplary embodiment of FIG. 10, the second dummy metal layer 520 has a bar shape extending substantially parallel to the edge of the first substrate 110 (e.g., the second dummy metal layer 520 extends lengthwise in a direction substantially parallel to the edge of the first substrate 110), and an edge of the second dummy metal layer 520 has a shape that includes a plurality of protrusions and depressions. For example, as shown in FIG. 10, protrusions and depressions may be alternately included at the edge of the second dummy metal layer 520. Thus, in an exemplary embodiment, the second dummy metal layer 520 has a bar shape extending in a first direction substantially parallel to the edge of the first substrate 110, and a plurality of protrusions and depressions extending in a second direction crossing the first direction (e.g., substantially perpendicular to the first direction).

A first edge of the second dummy metal layer 520 disposed near the edge of the first substrate 110 and a second edge of the second dummy metal layer 520 disposed on the opposite side of the first edge have shapes that include protrusions and depressions, as shown in FIG. 10. That is, respective edges of the second dummy metal layer 520 substantially parallel to the edge of the first substrate 110 have shapes that include protrusions and depressions. As a result, a total length of the edge of the second dummy metal layer 520 is longer than the total length of the edge of the second dummy metal layer of the previous exemplary embodiment. Therefore, when a permeation path of external oxygen or moisture increases, the permeation may be efficiently prevented or reduced, and static electricity may be efficiently dispersed.

It has been described above that in an exemplary embodiment, the respective edges of the second dummy metal layer 520 have a shape that includes protrusions and depressions. However, the present invention is not limited thereto. For example, in an exemplary embodiment, one edge of the second dummy metal layer 520 may have a shape that includes protrusions and depressions, and the edge on the opposite side may have a linear shape (e.g., the edge may extend in a substantially straight line without any protrusions and depressions).

An organic light emitting device according to an exemplary embodiment will now be described with reference to FIGS. 11 and 12.

The organic light emitting device according to the exemplary embodiment shown in FIGS. 11 and 12 includes similar elements and configurations as those described with reference to the organic light emitting device according to the exemplary embodiment shown in FIGS. 1 to 8. For convenience of explanation, a further description of elements and configurations previously described may be omitted herein. The exemplary embodiment shown in FIGS. 11 and 12 is different from the previous exemplary embodiment in that a hole pattern is generated in the first dummy metal layer, which will now be described.

Figure 11:
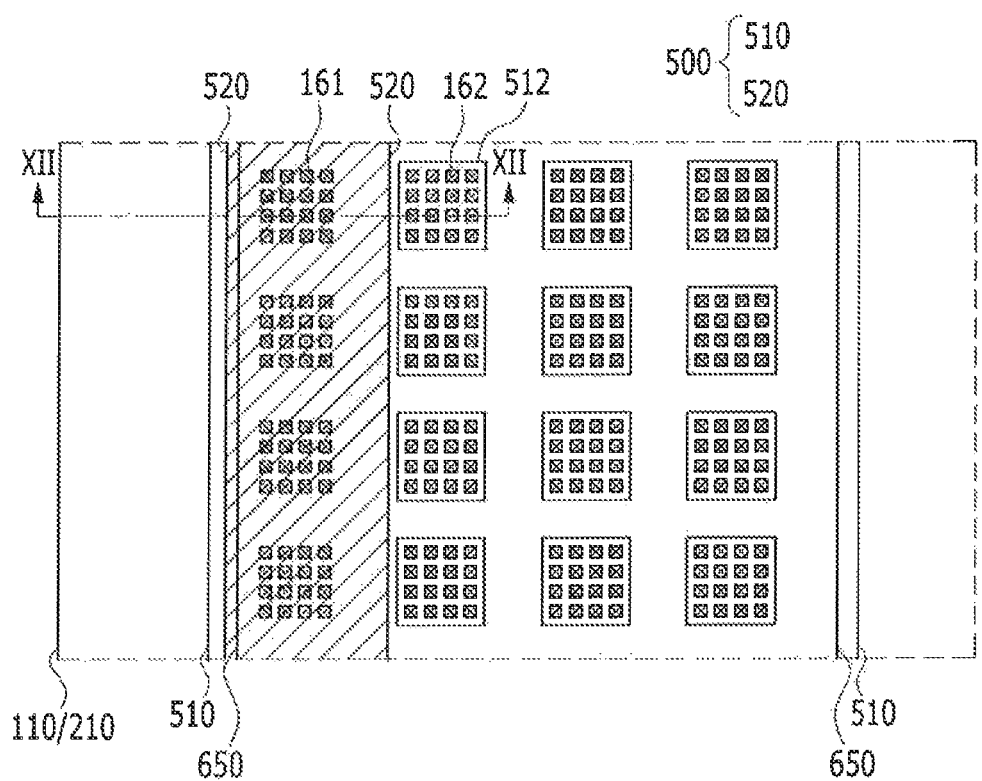
FIG. 11 shows a top plan view of an organic light emitting device according to an exemplary embodiment of the present invention.

FIG. 11 shows a top plan view of an organic light emitting device according to an exemplary embodiment. FIG. 12 shows a cross-sectional view of an organic light emitting device according to an exemplary embodiment with respect to line XII-XII of FIG. 11. FIGS. 11 and 12 show portion A that is in the non-display area (NA) of FIG. 1 according to an exemplary embodiment.

Figure 12:
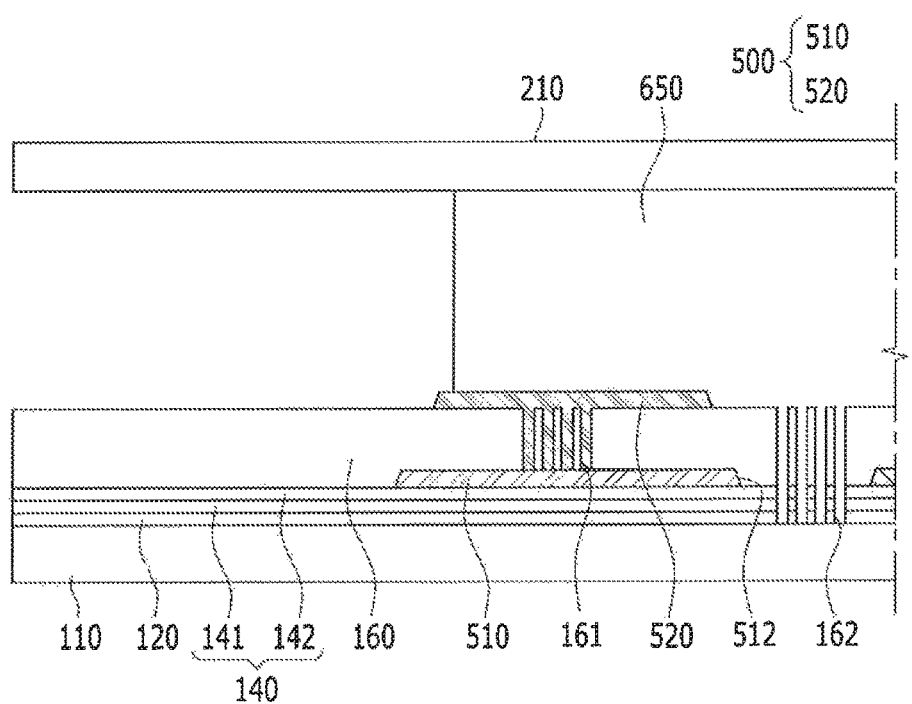
FIG. 12 shows a cross-sectional view of an organic light emitting device according to an exemplary embodiment with respect to line XII-XII of FIG. 11.

As shown in FIGS. 11 and 12, the organic light emitting device includes the first substrate 110, the dummy metal layer 500 disposed on the first substrate 110, the second substrate 210 that covers the first substrate 110, and the sealant 650 that bonds the first substrate 110 and the second substrate 210, which is similar to the previous exemplary embodiment.

The dummy metal layer 500 includes the first dummy metal layer 510 and the second dummy metal layer 520. In the exemplary embodiment previously described, the first dummy metal layer 510 has a bar shape extending substantially parallel to the edge of the first substrate 110, and no additional pattern is provided inside the bar shape. In the exemplary embodiment shown in FIGS. 11 and 12, the first dummy metal layer 510 has a bar shape substantially extending in parallel to the edge of the first substrate 110, and a hole pattern 512 is formed in the first dummy metal layer 510. The hole pattern 512 may be substantially simultaneously formed during a process of forming the first dummy metal layer 510 by depositing a metal material on the gate insulating layer 140 and patterning the same. Although the hole pattern 512 is shown as having a substantially quadrangle shape, the present invention is not limited thereto. For example, in exemplary embodiments, the hole pattern 512 may be variously modified to form a plurality of different shapes.

The hole pattern 512 is formed at a position where the first dummy metal layer 510 does not overlap the second dummy metal layer 520. Therefore, the hole pattern 512 does not overlap the second dummy metal layer 520.

The interlayer insulating layer 160 is disposed between the first dummy metal layer 510 and the second dummy metal layer 520, which overlap each other. The first contact hole 161 overlaps at least part of the first dummy metal layer 510 and is generated in the interlayer insulating layer 160. The second contact hole 162 is further formed in the interlayer insulating layer 160. The second contact hole 162 is disposed in the hole pattern 512. The second contact hole 162 may be disposed in a matrix form in the horizontal direction and the vertical direction in a plan view. For example, in an exemplary embodiment, sixteen second contact holes 162 disposed in a 4×4 matrix form may configure one set, and one set of second contact holes 162 may be disposed in one hole pattern 512. A plurality of hole patterns 512 may be disposed in a matrix form. Therefore, sets of the second contact holes 162 may be disposed in a matrix form. The above-described disposals of the second contact holes 162 and the hole patterns 512 are exemplary, and are modifiable in various ways.

The second contact hole 162 is formed in the gate insulating layer 140 and the buffer layer 120 disposed below the interlayer insulating layer 160. Therefore, the sealant 650 may contact the first substrate 110 through the second contact hole 162. However, the present invention is not limited thereto. For example, in an exemplary embodiment, the second contact hole 162 may be formed in the interlayer insulating layer 160. Further, the second contact hole 162 may be formed in the interlayer insulating layer 160 and the gate insulating layer 140 disposed below the same.

An organic light emitting device according to an exemplary embodiment will now be described with reference to FIG. 13.

The organic light emitting device according to the exemplary embodiment shown in FIG. 13 includes similar elements and configurations as those described with reference to the organic light emitting device according to the exemplary embodiment shown in FIGS. 11 and 12. For convenience of explanation, a further description of elements and configurations previously described may be omitted herein. In the exemplary embodiment described with reference to FIG. 13, a formation position of the first dummy metal layer is different from the exemplary embodiment previously described. An exemplary embodiment according to FIG. 13 will now be described.

Figure 13:
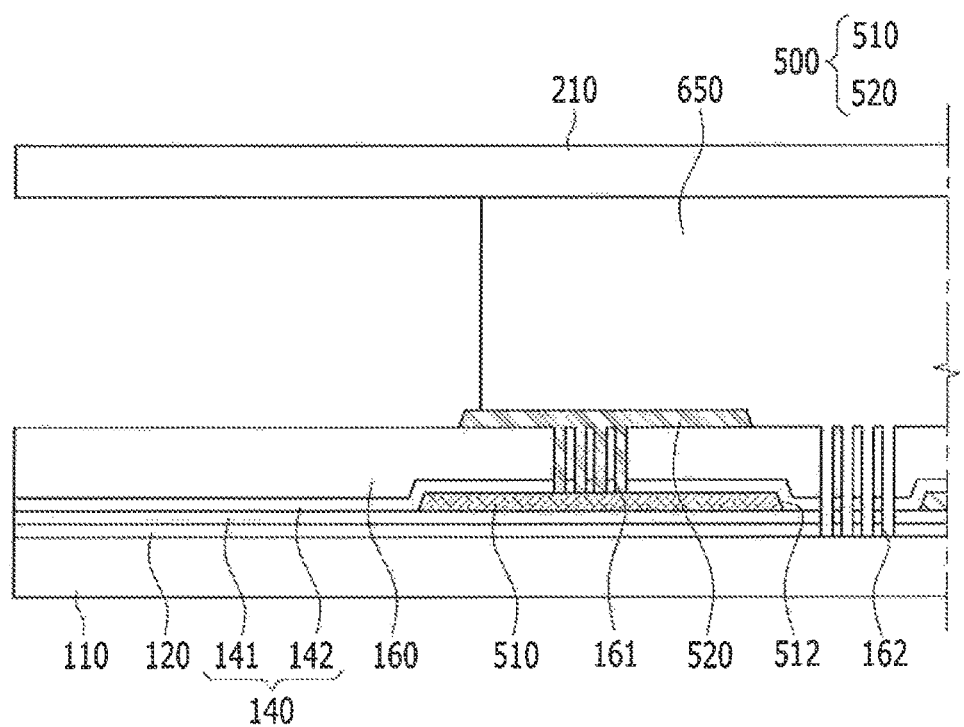
FIG. 13 shows a cross-sectional view of an organic light emitting device according to an exemplary embodiment of the present invention.

FIG. 13 shows a cross-sectional view of an organic light emitting device according to an exemplary embodiment. FIG. 13 shows portion A that is in the non-display area (NA) of FIG. 1, similar to FIG. 12.

In the exemplary embodiment previously described, the first dummy metal layer 510 is disposed over the second gate insulating layer 142. In the exemplary embodiment shown in FIG. 13, the first dummy metal layer 510 may be disposed below the second gate insulating layer 142. The first dummy metal layer 510 may be disposed between the first gate insulating layer 141 and the second gate insulating layer 142.

The first dummy metal layer 510 disposed in the non-display area (NA) may be made of a same material as the first gate wires 151, 152, 153, 155*a*, 155*b*, 155*c*, 155*d*, 155*e*, and 155*f* of FIGS. 5 to 8 disposed in the display area (DA), and may be disposed in a same layer as the first gate wires 151, 152, 153, 155*a*, 155*b*, 155*c*, 155*d*, 155*e*, and 155*f*. The first gate wires 151, 152, 153, 155*a*, 155*b*, 155*c*, 155*d*, 155*e*, and 155*f* of FIGS. 5 to 8 and the first dummy metal layer 510 may be substantially simultaneously formed by depositing a metal material on the first gate insulating layer 141 and patterning the same.

An organic light emitting device according to an exemplary embodiment will now be described with reference to FIG. 14.

The organic light emitting device according to the exemplary embodiment shown in FIG. 14 includes similar elements and configurations as those described with reference to the organic light emitting device according to the exemplary embodiment shown in FIGS. 11 and 12. For convenience of explanation, a further description of elements and configurations previously described may be omitted herein. In the exemplary embodiment described with reference to FIG. 14, a shape of an edge of the second dummy metal layer is different from the exemplary embodiment previously described. An exemplary embodiment according to FIG. 14 will now be described.

Figure 14:
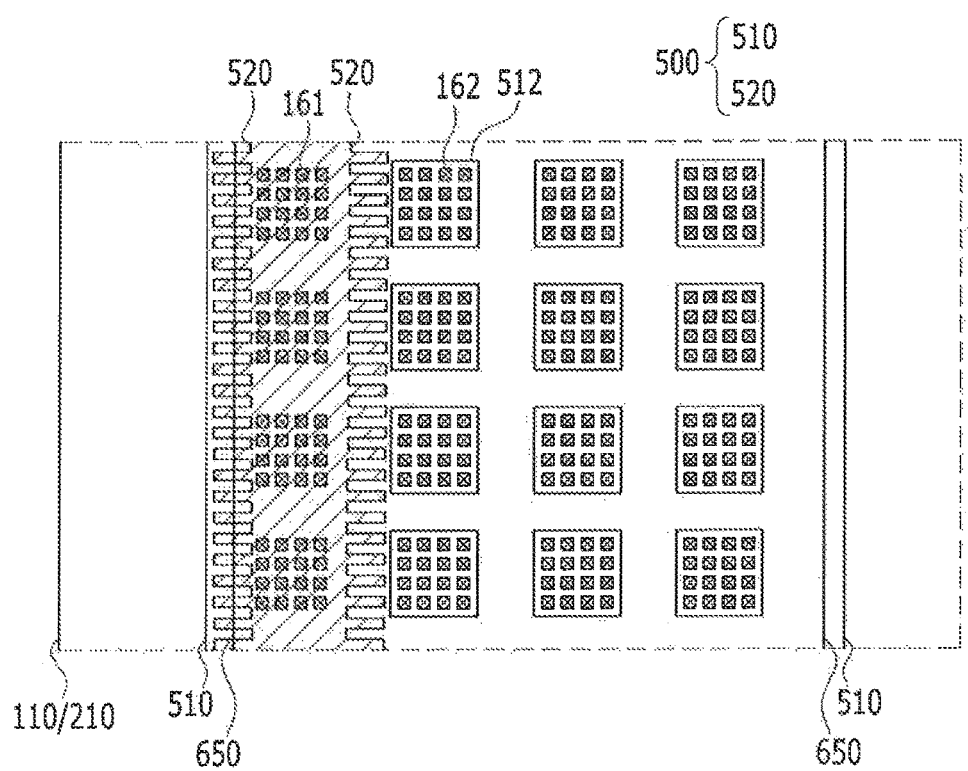
FIG. 14 shows a top plan view of an organic light emitting device according to an exemplary embodiment of the present invention.

FIG. 14 shows a top plan view of an organic light emitting device according to an exemplary embodiment. FIG. 14 shows portion A that is in the non-display area (NA) of FIG. 1.

As shown in FIG. 14, the organic light emitting device includes the first substrate 110, the dummy metal layer 500 disposed on the first substrate 110, the second substrate 210 that covers the first substrate 110, and the sealant 650 that bonds the first substrate 110 and the second substrate 210, which is similar to the exemplary embodiment previously described. The first contact hole 161 and the second contact hole 162 are formed in the interlayer insulating layer 160, which is disposed between the first dummy metal layer 510 and the second dummy metal layer 520. The second contact hole 162 is disposed in the hole pattern 512 of the first dummy metal layer 510, which is similar to the exemplary embodiment previously described.

In the exemplary embodiment previously described, the second dummy metal layer 520 has a bar shape extending substantially parallel to the edge of the first substrate 110, and the edge of the second dummy metal layer 520 has a linear shape (e.g., the edge of the second dummy metal layer 520 extends in a substantially straight line). In the exemplary embodiment shown in FIG. 14, the second dummy metal layer 520 has a bar shape extending substantially parallel to the edge of the first substrate 110 (e.g., the second dummy metal layer 520 extends lengthwise in a direction substantially parallel to the edge of the first substrate 110), and the edge of the second dummy metal layer 520 has a shape that includes a plurality of protrusions and depressions. For example, as shown in FIG. 14, protrusions and depressions may be alternately included at the edge of the second dummy metal layer 520. Thus, in an exemplary embodiment, the second dummy metal layer 520 has a bar shape extending in a first direction substantially parallel to the edge of the first substrate 110, and a plurality of protrusions and depressions extending in a second direction crossing the first direction (e.g., substantially perpendicular to the first direction).

A first edge of the second dummy metal layer 520 disposed near the edge of the first substrate 110 and a second edge disposed opposite the first edge have shapes including protrusions and depressions. That is, respective edges of the second dummy metal layer 520 that are substantially parallel to the edge of the first substrate 110 have shapes including protrusions and depressions. As a result, the edge of the second dummy metal layer 520 is longer than the edge of the second dummy metal layer of the exemplary embodiment previously described. Therefore, when a permeation path of external oxygen or moisture increases, the permeation may be efficiently prevented or reduced, and static electricity may be efficiently dispersed.

It has been described that the respective edges of the second dummy metal layer 520 have a shape including protrusions and depressions. However, the present invention is not limited thereto. For example, in an exemplary embodiment, one edge of the second dummy metal layer 520 may have a shape including protrusions and depressions and the edge on the opposite side may have a linear shape.

An organic light emitting device according to an exemplary embodiment will now be described with reference to FIGS. 15 and 16.

The organic light emitting device according to the exemplary embodiment shown in FIGS. 15 and 16 includes similar elements and configurations as those described with reference to the organic light emitting device according to the exemplary embodiment shown in FIGS. 1 to 8. For convenience of explanation, a further description of elements and configurations previously described may be omitted herein. The exemplary embodiment described with reference to FIGS. 15 and 16 is different from the exemplary embodiment previously described in that a third contact hole is further formed in the interlayer insulating layer.

Figure 15:
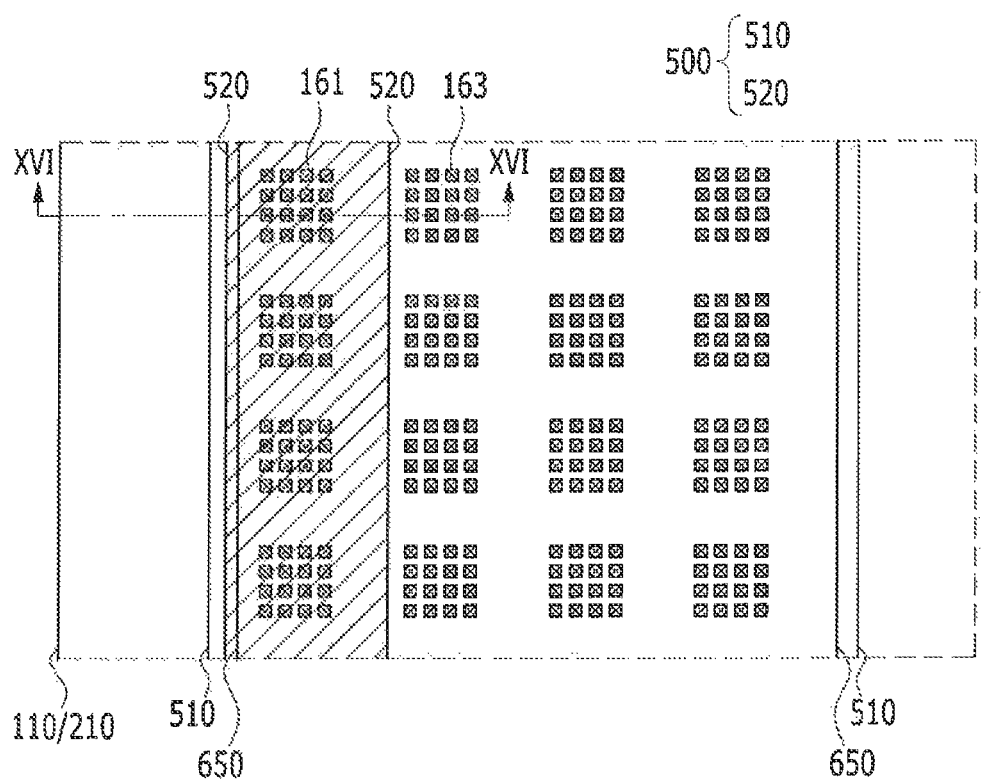
FIG. 15 shows a top plan view of an organic light emitting device according to an exemplary embodiment of the present invention.

FIG. 15 shows a top plan view of an organic light emitting device according to an exemplary embodiment. FIG. 16 shows a cross-sectional view of an organic light emitting device according to an exemplary embodiment with respect to line XVI-XVI of FIG. 15. FIGS. 15 and 16 show portion A that is in the non-display area (NA) of FIG. 1.

Figure 16:
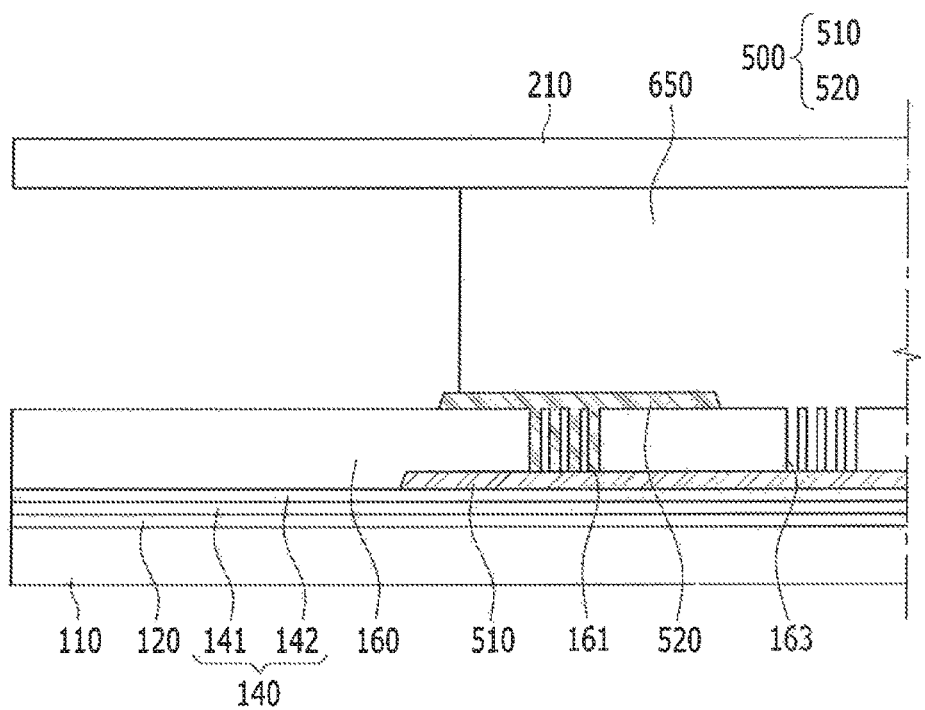
FIG. 16 shows a cross-sectional view of an organic light emitting device according to an exemplary embodiment with respect to line XVI-XVI of FIG. 15.

As shown in FIGS. 15 and 16, the organic light emitting device includes the first substrate 110, the dummy metal layer 500 disposed on the first substrate 110, the second substrate 210 that covers the first substrate 110, and the sealant 650 that bonds the first substrate 110 and the second substrate 210, which is similar to the exemplary embodiment previously described.

The dummy metal layer 500 includes the first dummy metal layer 510 and the second dummy metal layer 520. The interlayer insulating layer 160 is disposed on the first dummy metal layer 510. The first contact hole 161 and a third contact hole 163 overlapping at least part of the first dummy metal layer 510 are formed in the interlayer insulating layer 160. The first contact hole 161 is disposed at a portion where the first dummy metal layer 510 overlaps the second dummy metal layer 520. The first dummy metal layer 510 is connected to the second dummy metal layer 520 through the first contact hole 161. The third contact hole 163 is disposed at a portion where the first dummy metal layer 510 does not overlap the second dummy metal layer 520. The first dummy metal layer 510 contacts the sealant 650 through the second contact hole 162.

Similar to the first contact hole 161, the third contact hole 163 may be disposed in a matrix form in the horizontal direction and the vertical direction on the plane. For example, in an exemplary embodiment, sixteen third contact holes 163 disposed in a 4×4 matrix form may configure one set. A plurality of sets of the third contact holes 163 may be disposed in a matrix form. However, the present invention is not limited thereto.

An organic light emitting device according to an exemplary embodiment will now be described with reference to FIG. 17.

The organic light emitting device according to the exemplary embodiment shown in FIG. 17 includes similar elements and configurations as those described with reference to the organic light emitting device according to the exemplary embodiment shown in FIGS. 15 and 16. For convenience of explanation, a further description of elements and configurations previously described may be omitted herein. In the exemplary embodiment described with reference to FIG. 17, a formation position of the first dummy metal layer is different from the exemplary embodiment previously described. An exemplary embodiment according to FIG. 17 will now be described.

Figure 17:
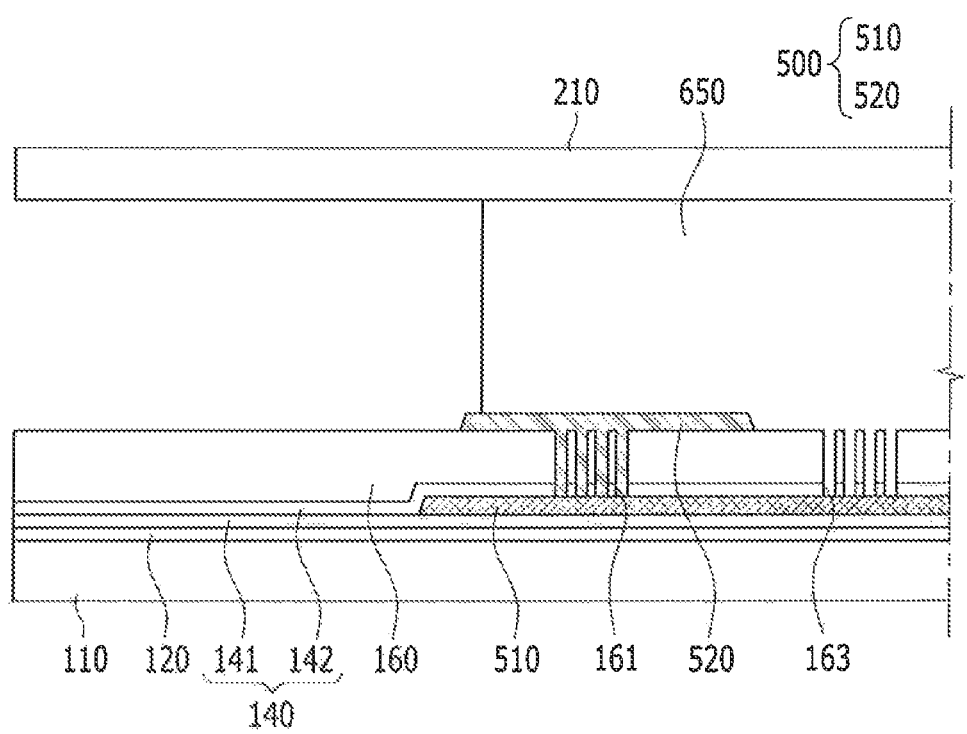
FIG. 17 shows a cross-sectional view of an organic light emitting device according to an exemplary embodiment of the present invention.

FIG. 17 shows a cross-sectional view of an organic light emitting device according to an exemplary embodiment. FIG. 17 shows portion A that is in the non-display area (NA) of FIG. 1 similar to FIG. 16.

In the exemplary embodiment previously described, the first dummy metal layer 510 is disposed over the second gate insulating layer 142. In the exemplary embodiment shown in FIG. 17, the first dummy metal layer 510 may be disposed below the second gate insulating layer 142. Further, the first dummy metal layer 510 may be disposed between the first gate insulating layer 141 and the second gate insulating layer 142.

The first dummy metal layer 510 disposed in the non-display area (NA) may be made of a same material as the first gate wires 151, 152, 153, 155*a*, 155*b*, 155*c*, 155*d*, 155*e*, and 155*f* of FIGS. 5 to 8 disposed in the display area (DA), and may be disposed in a same layer as the first gate wires 151, 152, 153, 155*a*, 155*b*, 155*c*, 155*d*, 155*e*, and 155*f*. The first gate wires 151, 152, 153, 155*a*, 155*b*, 155*c*, 155*d*, 155*e*, and 155*f* of FIGS. 5 to 8 and the first dummy metal layer 510 may be substantially simultaneously formed by depositing a metal material on the first gate insulating layer 141 and patterning the same.

An organic light emitting device according to an exemplary embodiment will now be described with reference to FIG. 18.

The organic light emitting device according to the exemplary embodiment shown in FIG. 18 includes similar elements and configurations as those described with reference to the organic light emitting device according to the exemplary embodiment shown in FIGS. 15 and 16. For convenience of explanation, a further description of elements and configurations previously described may be omitted herein. In the exemplary embodiment described with reference to FIG. 18, a shape of an edge of the second dummy metal layer is different from the exemplary embodiment previously described. An exemplary embodiment according to FIG. 18 will now be described.

Figure 18:
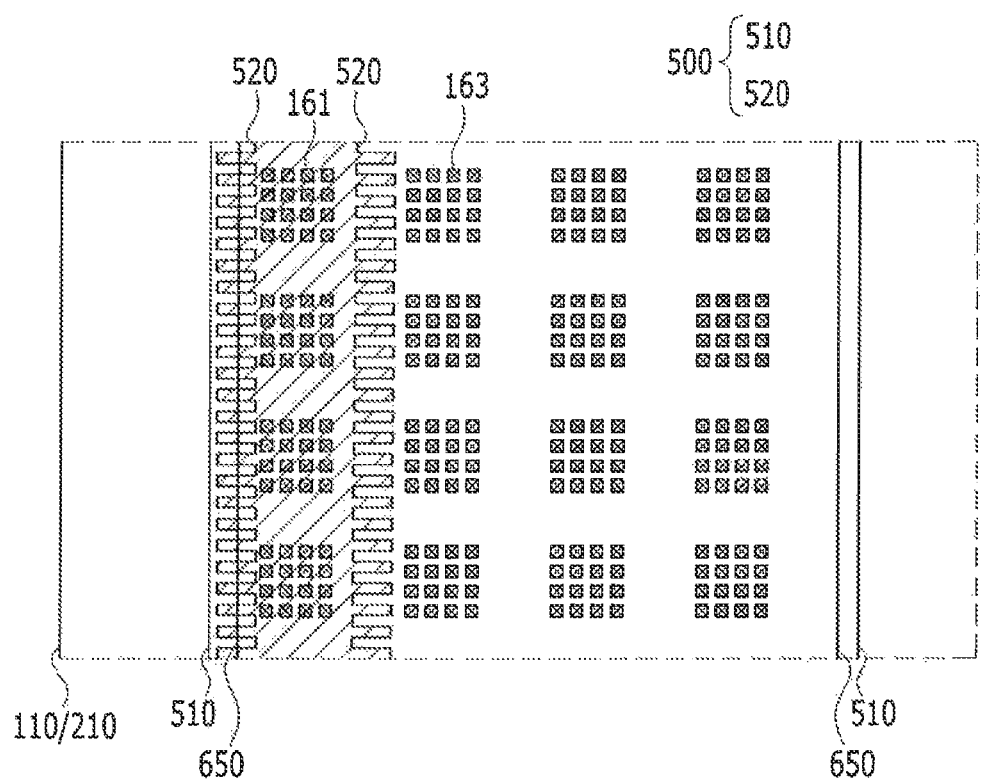
FIG. 18 shows a top plan view of an organic light emitting device according to an exemplary embodiment of the present invention.

FIG. 18 shows a top plan view of an organic light emitting device according to an exemplary embodiment. FIG. 18 shows portion A that is in the non-display area (NA) of FIG. 1 similar to FIG. 15.

As shown in FIG. 18, the organic light emitting device includes the first substrate 110, the dummy metal layer 500 disposed on the first substrate 110, the second substrate 210 that covers the first substrate 110, and the sealant 650 that bonds the first substrate 110 and the second substrate 210, which is similar to the exemplary embodiment previously described.

The dummy metal layer 500 includes the first dummy metal layer 510 and the second dummy metal layer 520. In the exemplary embodiment previously described, the second dummy metal layer 520 has a bar shape extending substantially parallel to the edge of the first substrate 110, and an edge of the second dummy metal layer 520 has a linear shape. In the exemplary embodiment shown in FIG. 18, the second dummy metal layer 520 has a bar shape extending substantially parallel to the edge of the first substrate 110 (e.g., the second dummy metal layer 520 extends lengthwise in a direction substantially parallel to the edge of the first substrate 110), and an edge of the second dummy metal layer 520 has a shape including protrusions and depressions. For example, as shown in FIG. 18, protrusions and depressions may be alternately included at the edge of the second dummy metal layer 520. Thus, in an exemplary embodiment, the second dummy metal layer 520 has a bar shape extending in a first direction substantially parallel to the edge of the first substrate 118, and a plurality of protrusions and depressions extending in a second direction crossing the first direction (e.g., substantially perpendicular to the first direction).

A first edge of the second dummy metal layer 520 disposed near the edge of the first substrate 110 and a second edge of the second dummy metal layer 520 disposed on the opposite side of the first edge have shapes including protrusions and depressions. That is, respective edges of the second dummy metal layer 520 substantially parallel to the edge of the first substrate 110 have shapes including protrusions and depressions. As a result, the edge of the second dummy metal layer 520 is longer than the edge of the second dummy metal layer of the exemplary embodiment previously described. Therefore, when a permeation path of external oxygen or moisture increases, the permeation may be efficiently prevented or reduced, and static electricity may be efficiently dispersed.

Although it has been described herein that the respective edges of the second dummy metal layer 520 have a shape including protrusions and depressions, the present invention is not limited thereto. For example, in an exemplary embodiment, one edge of the second dummy metal layer 520 may have a shape including protrusions and depressions and the edge on the opposite side may have a linear shape.

Exemplary embodiments of the present invention provide an organic light emitting device in which a sealant is prevented from peeling off of a substrate.

According to exemplary embodiments of the present invention, the dummy metal layer includes a plurality of layers electrically connected to one another, thereby reducing resistance and preventing the sealant from being stripped off as a result of static electricity.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An organic light emitting device, comprising:
   a first substrate comprising a display area and a non-display area;
   a metal layer disposed on the first substrate in the non-display area, wherein the metal layer comprises a first metal layer and a second metal layer, and the first metal layer and the second metal layer overlap each other;
   an insulating layer disposed between the first metal layer and the second metal layer in a cross-sectional view;
   a second substrate disposed on the first substrate; and
   a sealant disposed between the first substrate and the second substrate and overlapping the metal layer,
   wherein the first metal layer is a solid metal layer without an opening in the cross-sectional view and includes a portion that overlaps with the sealant in the cross-sectional view,
   wherein the second metal layer is disposed between the first metal layer and the sealant and connected to the first metal layer through a first contact hole in the insulating layer,
   wherein, within the first contact hole, a plurality of penetration portions of the second metal layer are separated from one another by a plurality of separation portions of the insulating layer,
   wherein a portion of the sealant directly contacts the second metal layer, and the sealant is a single layer made of a frit,
   wherein the second metal layer has a first end, an intermediate portion aligned with the first contact hole formed in the insulating layer, and a second end along a width direction inward from the outside of the first substrate in the cross-sectional view, the portion of the sealant covers only the second end of the first and second ends of the second metal layer in a plan view, and the second end is disposed further inward from the outside of the first substrate than the first end in the width direction in the cross-sectional view,
   wherein the portion of the sealant extends from the second end of the second metal layer to a portion of the second metal layer disposed further inward from the outside of the first substrate than the first end in the width direction in the cross-sectional view, and contacts the intermediate portion of the second metal layer to connect the sealant to the first metal layer, which has a greater resistance than the second metal layer, through the first contact hole in an area located between the second end of the second metal layer covered by the portion of the sealant and the portion of the second metal layer disposed further inward from the outside of the first substrate than the first end in the width direction in the cross-sectional view, wherein a first end of the first metal layer extends beyond the first end of the second metal layer in a direction toward the outside of the first substrate in the cross-sectional view, wherein a shape of the first metal layer and the second metal layer is U-shaped in the plan view, and wherein the first and second metal layers are not electrically connected with other elements.

2. The organic light emitting device of claim 1, wherein the first contact hole overlaps at least a part of the first metal layer, and the second metal layer is disposed on the insulating layer and is connected to the first metal layer through the first contact hole.

3. The organic light emitting device of claim 1, wherein the first metal layer is made of molybdenum, and the second metal layer is made of aluminum.

4. The organic light emitting device of claim 1, further comprising:

a semiconductor disposed on the first substrate in the display area;

a gate insulating layer disposed on the semiconductor;

a gate wire disposed on the gate insulating layer, wherein the insulating layer is disposed on the gate wire; and a data wire disposed on the insulating layer.

5. The organic light emitting device of claim 4, wherein the first metal layer is made of a same material as the gate wire, and is disposed in a same layer as the gate wire.

6. The organic light emitting device of claim 5, wherein the second metal layer is made of a same material as the data wire, and is disposed in a same layer as the data wire.

7. The organic light emitting device of claim 4, wherein the gate insulating layer comprises a first gate insulating layer and a second gate insulating layer, and the gate wire comprises a first gate wire disposed between the first gate insulating layer and the second gate insulating layer in the cross-sectional view, and a second gate wire disposed on the second gate insulating layer.

8. The organic light emitting device of claim 7, wherein the first metal layer is made of a same material as the first gate wire or the second gate wire, and is disposed in a same layer as the first gate wire or the second gate wire.

9. The organic light emitting device of claim 1, wherein the first metal layer and the second metal layer have a bar shape extending substantially parallel to an edge of the first substrate.

10. The organic light emitting device of claim 9, wherein a width of the second metal layer is less than a width of the first metal layer in the plan view.

11. The organic light emitting device of claim 10, wherein a first edge of the second metal layer comprises a first plurality of protrusions and depressions.

12. The organic light emitting device of claim 11, wherein the first edge of the second metal layer is adjacent to the edge of the first substrate.

13. The organic light emitting device of claim 11, wherein a second edge of the second metal layer that opposes the first edge of the metal layer comprises a second plurality of protrusions and depressions.

14. The organic light emitting device of claim 1, wherein a hole pattern is formed in the first metal layer, a second contact hole is formed in the insulating layer, and the second contact hole is disposed in the hole pattern.

15. The organic light emitting device of claim 14, wherein the sealant is disposed in the second contact hole.

16. The organic light emitting device of claim 15, wherein the sealant contacts the first substrate through the second contact hole.

17. The organic light emitting device of claim 14, wherein a plurality of contact holes, including the second contact hole, is disposed in the hole pattern.

18. The organic light emitting device of claim 14, wherein a plurality of hole patterns, including the hole pattern, is disposed in a matrix form in the first metal layer.

19. The organic light emitting device of claim 14, wherein the second metal layer does not overlap the hole pattern.

20. The organic light emitting device of claim 14, wherein a first edge of the second metal layer adjacent to an edge of the first substrate, and a second edge of the second metal layer that opposes the first edge of the second metal layer each comprise a plurality of protrusions and depressions.

21. The organic light emitting device of claim 1, wherein the insulating layer comprises the first contact hole and a second contact hole overlapping at least a part of the first metal layer, the second metal layer is connected to the first metal layer through the first contact hole, and the sealant contacts the first metal layer through the second contact hole.

22. An organic light emitting device, comprising:

a first substrate comprising a display area and a non-display area;

a second substrate opposing the first substrate;

a pixel disposed on the first substrate in the display area, wherein the pixel comprises:

a storage capacitor;

an organic light emitting diode comprising an anode and a cathode;

a driving transistor comprising a first gate electrode; and a switching transistor comprising a second gate electrode;

a metal layer disposed on the first substrate in the non-display area, wherein the metal layer comprises a first metal layer and a second metal layer, and the first metal layer and the second metal layer overlap each other;

an insulating layer disposed on the first substrate in the non-display area between the first metal layer and the second metal layer in a cross-sectional view; and a sealant disposed on the first substrate in the non-display area between the first substrate and the second substrate, and overlapping the metal layer, wherein the first metal layer is a solid metal layer without an opening in the cross-sectional view and includes a portion that overlaps with the sealant in the cross-sectional view, wherein the second metal layer is disposed between the first metal layer and the sealant and connected to the first metal layer through a contact hole in the insulating layer, wherein, within the contact hole, a plurality of penetration portions of the second metal layer are separated from one another by a plurality of separation portions of the insulating layer, wherein the first metal layer, the first gate electrode, and the second gate electrode are made of a same material, wherein the sealant is a single layer made of a frit, and a portion of the sealant directly contacts the second metal layer, wherein the second metal layer has a first end, an intermediate portion aligned with the contact hole formed in the insulating layer, and a second end along a width direction inward from the outside of the first substrate in the cross-sectional view, the portion of the sealant covers only the second end of the first and second ends of the second metal layer in a plan view, and the second end is disposed further inward from the outside of the first substrate than the first end in the width direction in the cross-sectional view, wherein the portion of the sealant extends from the second end of the second metal layer to a portion of the second metal layer disposed further inward from the outside of the first substrate than the first end in the width direction in the cross-sectional view, and contacts the intermediate portion of the second metal layer to connect the sealant to the first metal layer, which has a greater resistance than the second metal layer, through the first contact hole in an area located between the second end of the second metal layer covered by the portion of the sealant and the portion of the second metal layer disposed further inward from the outside of the first substrate than the first end in the width direction in the cross-sectional view, wherein a first end of the first metal layer extends beyond the first end of the second metal layer in a direction toward the outside of the first substrate in the cross-sectional view, wherein a shape of the first metal layer and the second metal layer is U-shaped in the plan view, and wherein the first and second metal layers are not electrically connected with other elements.

23. The organic light emitting device of claim 22, wherein the first gate electrode is connected to a first end of the storage capacitor, a second end of the storage capacitor is connected to a driving voltage line, the second gate electrode is connected to a scan line, the anode is connected to a drain electrode of the driving transistor, and the cathode is connected to a common voltage line.

24. The organic light emitting device of claim 22, wherein the contact hole overlaps at least a part of the first metal layer, and the second metal layer is disposed on the insulating layer and is connected to the first metal layer through the contact hole.

25. The organic light emitting device of claim 22, wherein the first metal layer is made of molybdenum, and the second metal layer is made of aluminum.

* * * * *